US011328751B2

(12) United States Patent
Kim

(10) Patent No.: US 11,328,751 B2
(45) Date of Patent: May 10, 2022

(54) SEMICONDUCTOR DEVICE FOR STABLE CONTROL OF POWER-DOWN MODE

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/150,745

(22) Filed: Jan. 15, 2021

(65) Prior Publication Data
US 2022/0084562 A1  Mar. 17, 2022

(30) Foreign Application Priority Data

Sep. 14, 2020  (KR) .................. 10-2020-0117661

(51) Int. Cl.
G11C 5/14        (2006.01)
(52) U.S. Cl.
CPC .................. G11C 5/148 (2013.01)
(58) Field of Classification Search
CPC ................................ G11C 5/148
See application file for complete search history.

(56) References Cited

U.S. PATENT DOCUMENTS

| 2010/0188922 | A1* | 7/2010 | Nakaoka | G11C 5/147 365/227 |
| 2018/0277178 | A1* | 9/2018 | Kim | G11C 7/222 |
| 2020/0141998 | A1* | 5/2020 | Kim | G01R 31/31721 |
| 2020/0143850 | A1* | 5/2020 | Kim | H03K 19/1733 |
| 2020/0150710 | A1* | 5/2020 | Kim | G06F 1/3203 |

FOREIGN PATENT DOCUMENTS

KR    10-2018-0109215    10/2018

* cited by examiner

Primary Examiner — Khamdan N. Alrobaie
(74) Attorney, Agent, or Firm — IP & T Group LLP

(57) ABSTRACT

A semiconductor device includes: a first buffer circuit configured to receive a chip select signal in a power-down mode in response to a first select signal, a second buffer circuit configured to receive the chip select signal in an active mode in response to the first select signal, a power supply circuit configured to supply external power to a plurality of logic elements in the active mode in response to a second select signal, and not supply the external power to the plurality of logic elements in the power-down mode, and a select control circuit configured to transition a logic level of the second select signal at a first edge of a first chip select signal in the power-down mode, and then transition a logic level of the first select signal at a following second edge of the first chip select signal to exit from the power-down mode and enter the active mode.

20 Claims, 11 Drawing Sheets

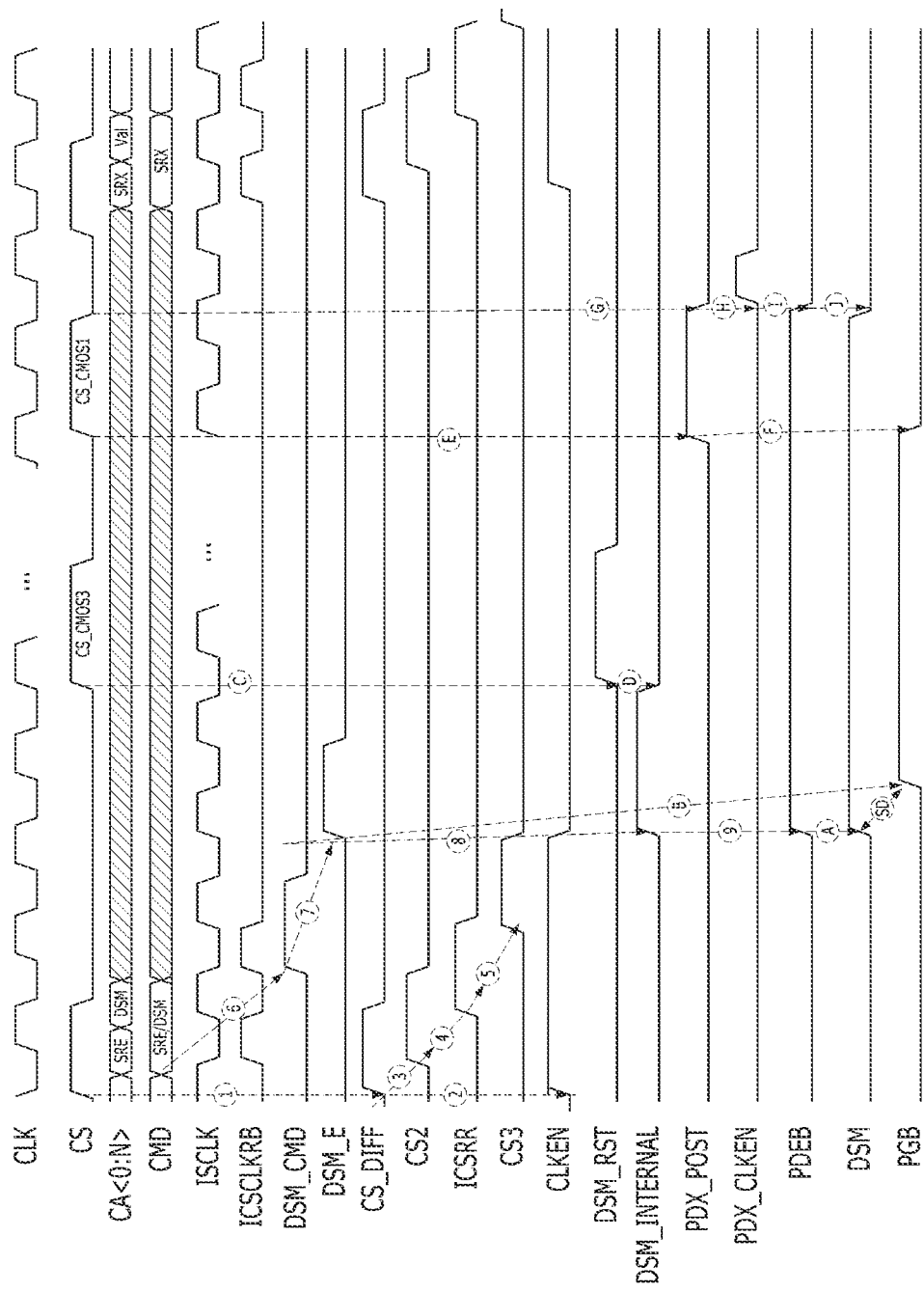

SEMICONDUCTOR DEVICE FOR STABLE CONTROL OF POWER-DOWN MODE

CROSS-REFERENCE TO RELATED APPLICATION

This application claims priority under 35 U.S.C. § 119 to Korean Patent Application No. 10-2020-0117661, filed on Sep. 14, 2020, which is incorporated herein by reference in its entirety.

BACKGROUND

1. Field

Various embodiments relate to a semiconductor device, and more particularly, to a semiconductor device for stable control of a power-down mode.

2. Discussion of the Related Art

Recently, electronic products have been developed to have a smaller size, a longer operation time, a larger capacity and more functions in response to market demand. Another marketable characteristic of portable electronic products is low power consumption. That and miniaturization are particularly important. Therefore, semiconductor devices used in such products are being developed for low power consumption and miniaturization.

Through refinements in manufacturing processes that yield circuits with lower power voltage, it has become possible to miniaturize semiconductor devices. However, problems may be caused in that leakage current increases in a power-down mode and an operation speed cannot be increased in an active mode. In order to solve such problems, a power gating technique has been proposed.

In the power gating technique a MOS (metal oxide semiconductor) transistor with a relatively high threshold voltage is coupled in series between a power voltage (or a ground voltage) and a logic circuit such that the MOS transistor is turned on in an active mode (a power-on mode) to supply the power voltage (or the ground voltage) to the logic circuit with a relatively low threshold voltage so as to increase the operation speed of the logic circuit and is turned off in a power-down mode to cut off the logic circuit from the power voltage (or the ground voltage) so as to reduce the leakage current (sub-threshold current) of the logic circuit.

In particular, the power gating technique may be useful in reducing the power consumption of a large-scale integration (LSI) chip for a portable appliance which is in the power-down mode for a much longer time than the active mode. If a power network to which such power gating technique is applied is used, leakage current may be efficiently suppressed in the power-down mode, and the operation speed of a logic circuit may be increased in the active mode by flowing an appropriate level of current.

SUMMARY

Various embodiments are directed to a semiconductor device capable of preventing a power gating error from occurring in the process of exiting a power-down mode and entering an active mode.

In an embodiment, a semiconductor device may include: a first buffer circuit configured to receive a chip select signal in a power-down mode in response to a first select signal; a second buffer circuit configured to receive the chip select signal in an active mode in response to the first select signal; a power supply circuit configured to supply external power to a plurality of logic elements in the active mode in response to a second select signal, and not supply the external power to the plurality of logic elements in the power-down mode in response to the second select signal; and a select control circuit configured to transition a logic level of the second select signal at a first edge of a first chip select signal received through the first buffer circuit in the power-down mode, and then transition a logic level of the first select signal at a following second edge of the first chip select signal to exit from the power-down mode and enter the active mode.

The select control circuit may include: a detection circuit configured to detect the first and second edges of the first chip select signal in the power-down mode; and a select signal generation circuit configured to generate the first select signal and the second select signal in response to an output signal of the detection circuit and a power-down command corresponding to the power-down mode.

The detection circuit may include: a first edge detection circuit configured to generate a first edge detection signal by detecting the first edge of the first chip select signal in the power-down mode; and a second edge detection circuit configured to generate a second edge detection signal by detecting the second edge of the first chip select signal in response to the first edge detection signal in the power-down mode.

The select signal generation circuit may include: a first select signal generation circuit configured to set the first select signal to a first logic level in response to the second edge detection signal; and a second select signal generation circuit configured to set the second select signal to a first logic level in response to the first edge detection signal.

The select control circuit may enter, in response to the power-down command, the power-down mode from the active mode by transitioning the logic level of the first select signal and then by transitioning the logic level of the second select signal a set amount of time after transitioning the logic level of the first select signal.

The first select signal generation circuit may set the first select signal to a second logic level in response to the power-down command, and the second select signal generation circuit may set, in response to the power-down command, the second select signal to a second logic level the set amount of time after the first select signal is set to the second logic level.

The first buffer circuit may output the first chip select signal by buffering the chip select signal received from an outside during a period in which the first select signal is set to a second logic level, and may be disabled during a period in which the first select signal is set to the first logic level, and the second buffer circuit may output a second chip select signal by buffering the chip select signal received from an outside during the period in which the first select signal is set to the first logic level, and may be disabled during the period in which the first select signal is set to the second logic level.

The power supply circuit may supply external power to the plurality of logic elements by allowing coupling of an external power line and a virtual power line during the period in which the second select signal is set to the first logic level, and may block the external power from being supplied to the plurality of logic elements by cutting off coupling of the external power line and the virtual power line during the period in which the second select signal is set to the second logic level.

In an embodiment, a semiconductor device may include: a first buffer circuit configured to receive a chip select signal in a first power-down mode or a second power-down mode in response to a first select signal; a second buffer circuit configured to receive the chip select signal in an active mode in response to the first select signal; a power supply circuit configured to supply external power to a plurality of logic elements in the active mode in response to a second select signal, and not supply the external power to the plurality of logic elements in the first power-down mode or the second power-down mode in response to the second select signal; and a select control circuit configured to transition a logic level of the second select signal at a first edge of a first chip select signal received through the first buffer circuit in the first or second power-down mode, and then transition a logic level of the first select signal at a following second edge of the first chip select signal to exit from the power-down mode and enter the active mode. In the first power-down mode, the select control circuit may receive the chip select signal, first received through the first buffer circuit as the first chip select signal. In the second power-down mode, the select control circuit may receive the chip select signal, first received through the first buffer circuit, as a third chip select signal, and may receive the chip select signal, second received through the first buffer circuit in the second power-down mode, as the first chip select signal.

The select control circuit may include: a detection circuit configured to detect the first and second edges of the first chip select signal in the first power-down mode, and detect an edge of the third chip select signal and the first and second edges of the first chip select signal in the second power-down mode; and a select signal generation circuit configured to generate the first select signal and the second select signal in response to an output signal of the detection circuit, a first power-down command corresponding to the first power-down mode and a second power-down command corresponding to the second power-down mode.

The detection circuit may include: a first edge detection circuit configured to generate a first edge detection signal by detecting the first edge of the first chip select signal in the first or second power-down mode, and generate a third edge detection signal by detecting a first edge of the third chip select signal in the second power-down mode; and a second edge detection circuit configured to generate a second edge detection signal by detecting the second edge of the first chip select signal in response to the first edge detection signal in the first or second power-down mode.

The select signal generation circuit may include: a first select signal generation circuit configured to set the first select signal to a first logic level in response to the second edge detection signal; and a second select signal generation circuit configured to set the second select signal to a first logic level in response to the first edge detection signal.

The select control circuit may enter, in response to the first power-down command or the second power-down command, the first power-down mode or the second power-down mode from the active mode by transitioning the logic level of the first select signal and then by transitioning the logic level of the second select signal a set amount of time after transitioning the logic level of the first select signal.

The first select signal generation circuit may set the first select signal to a second logic level in response to the first power-down command or the second power-down command, and the second select signal generation circuit may set, in response to the first power-down command or the second power-down command, the second select signal to a second logic level a set amount of time after the first select signal is set to a second logic level.

The first buffer circuit may output the third chip select signal or the first chip select signal by buffering the chip select signal received from an outside during a period in which the first select signal is set to a second logic level, and may be disabled during a period in which the first select signal is set to the first logic level, and the second buffer circuit may output a second chip select signal by buffering the chip select signal received from an outside during the period in which the first select signal is set to the first logic level, and may be disabled during the period in which the first select signal is set to the second logic level.

The power supply circuit may supply external power to the plurality of logic elements by allowing coupling of an external power line and a virtual power line during the period in which the second select signal is set to the first logic level, and may block the external power from being supplied to the plurality of logic elements by cutting off coupling of the external power line and the virtual power line during the period in which the second select signal is set to the second logic level.

The select control circuit may further include: a detecting operation select circuit configured to generate a detection select signal which is initialized to a first state, and, after transitioning the detection select signal to a second state in response to the second power-down command, transition the detection select signal to the first state in response to the second edge detection signal.

The detection circuit may perform an operation in response to the detection select signal of the first state in the first power-down mode. The detection circuit may perform an operation in response to the detection select signal of the second state in the second power-down mode.

The select control circuit may further include: an internal operation select circuit configured to generate an internal select signal which is initialized to a third state, and, after transitioning the internal select signal to a fourth state in response to the second power-down command, transition the internal select signal to the third state in response to the third edge detection signal.

The semiconductor device may further include: an internal circuit configured to be enabled in response to the internal select signal of the third state and be disabled in response to the internal select signal of the fourth state.

In an embodiment, a semiconductor device may include: a power-gated circuitry configured to become activated and operative in response to a second select signal; and a power gating control circuit configured to control the activation of the power-gated circuitry, and including: first circuitry configured to: stay activated in an active mode and stay deactivated in a power-down mode, and exit the power-down mode and enter the active mode in response to a first select signal; and second circuitry configured to provide, in the power-down mode, the second select signal at a first edge of a control signal and the first select signal at a second edge, immediately following the first edge, of the control signal.

According to embodiments of the disclosure, by controlling an operation time of a power gating circuit to occur before entering an active mode, during a process in which a semiconductor device exits a power-down mode and enters the active mode, it is possible to prevent a power gating error from occurring in the semiconductor device.

Through this, it is possible to stably control a power-down mode operation of the semiconductor device.

BRIEF DESCRIPTION OF THE DRAWINGS

FIG. 13 is a timing diagram illustrating operation of a power gating system, such as that illustrated in FIG. 5.

DETAILED DESCRIPTION

Figure 1:
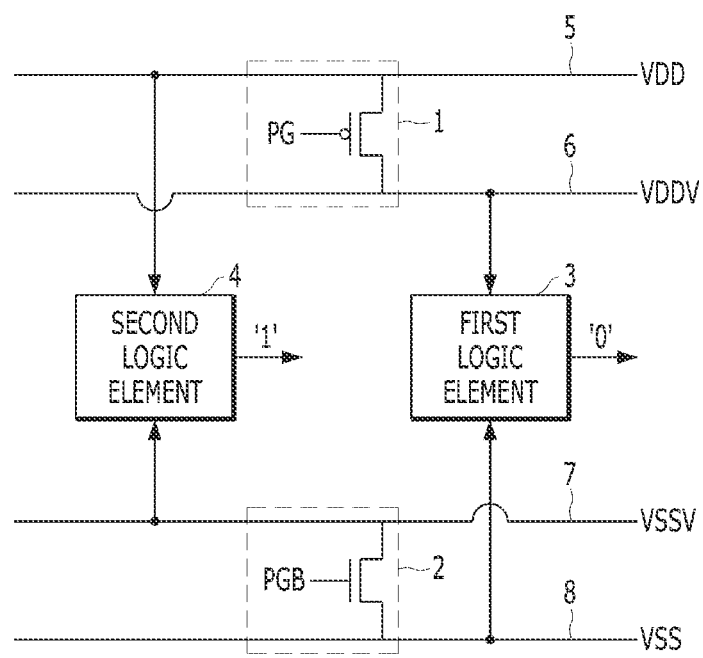
FIG. 1 is a diagram illustrating a zigzag power gating technique.

Various examples of the disclosure are described below in more detail with reference to the accompanying drawings. Aspects and features of the present technology, however, may be embodied in different ways to form other embodiments, including variations of any of the disclosed embodiments. Thus, the disclosed technology is not to be construed as being limited to the embodiments set forth herein. Rather, the described embodiments are provided so that this disclosure is thorough and complete, and fully conveys the disclosure to those skilled in the art to which the technology pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s). The term "embodiments" when used herein does not necessarily refer to all embodiments.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the disclosed technology. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the technology belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the technology. The technology may be practiced without some or all of these specific details. In other instances, well-known process structures and/or processes have not been described in detail in order not to unnecessarily obscure the technology.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

FIG. 1 is a diagram illustrating a zigzag power gating technique.

Referring to FIG. 1, to explain a zigzag power gating technique as a type of a power gating technique, an example of a circuit (collectively, elements 1, 2, 5, 6, 7 and 8), which supplies, by applying the zigzag power gating technique, power to logic elements 3 and 4 in a semiconductor device, is illustrated.

In detail, the circuit to which the zigzag power gating technique is applied may include a PMOS (P-channel metal oxide semiconductor) transistor 1, an NMOS (N-channel metal oxide semiconductor) transistor 2, a line 5 to which a power voltage VDD is supplied, a virtual power voltage (VDDV) line 6, a virtual ground voltage (VSSV) line 7, and a line 8 to which a ground voltage VSS is supplied.

The power voltage VDD and the virtual power voltage VDDV are applied to the circuit through the PMOS transistor 1, and the ground voltage VSS and the virtual ground voltage VSSV are applied through the NMOS transistor 2. The PMOS transistor 1 and the NMOS transistor 2 may be controlled in response to a select signal PG and PGB, respectively. The logic level of each such signal is set depending on whether the circuit has entered a power-down mode.

In an active mode, logic levels of signals outputted from the logic elements 3 and 4 in the semiconductor device may not be fixed, and, as the PMOS transistor 1 and the NMOS transistor 2 are turned on, the power voltage VDD and the ground voltage VSS may be supplied to the logic elements 3 and 4. On the other hand, in the power-down mode, logic levels of signals outputted from the logic elements 3 and 4 in the semiconductor device may be fixed, and, as the PMOS transistor 1 and the NMOS transistor 2 are turned off, leakage current from the logic elements 3 and 4 may be reduced.

In the illustrated embodiment of FIG. 1, logic element 3 may be directly coupled to the virtual power voltage line 6 and the ground voltage line 8 and may operate using ground voltage VSS, and logic element 4 may be directly coupled to the power voltage line 5 and the virtual ground voltage line 7 and may operate using the power voltage VDD. For each logic element, it may be determined whether it is coupled to the power voltage or the ground voltage, depending on logic level of the signal outputted by that logic element in the power-down mode.

For example, the first logic element 3 may be configured such that a low logic level '0' is outputted in the power-down mode. The first logic element 3 is coupled to a drain of the PMOS transistor 1 through the virtual power voltage line 6. Therefore, leakage current of the first logic element 3 may occur in the process of generating an output signal fixed to a low logic level '0,' and may be effectively reduced when the PMOS transistor 1 is turned off in the power-down mode. Since the first logic element 3 is directly coupled to the line 8 to which the ground voltage VSS is supplied, the value of the output signal fixed to a low logic level '0' may be maintained even when the PMOS transistor 1 and the NMOS transistor 2 are turned off in the power-down mode.

Likewise, the second logic element 4 may be configured such that a high logic level '1' is outputted in the power-down mode. The second logic element 4 is coupled to a drain of the NMOS transistor 2 through the virtual ground voltage line 7. Therefore, leakage current of the second logic element 4 may occur in the process of generating an output signal fixed to a high logic level '1,' and may be effectively reduced when the NMOS transistor 2 is turned off in the power-down mode. Since the second logic element 4 is directly coupled to the line to which the power voltage VDD is supplied, the value of the output signal fixed to a high logic level '1' may be maintained even when the PMOS transistor 1 and the NMOS transistor 2 are turned off in the power-down mode.

As described above, in the case where the zigzag power gating circuit (collectively, elements 1, 2, 5, 6, 7 and 8) is applied to the logic elements 3 and 4 in the semiconductor device, the occurrence of leakage current in the power-down mode may be minimized, and a logic level of a signal outputted from each of the logic elements 3 and 4 may be maintained in a desired state.

However, when the PMOS transistor 1 and the NMOS transistor 2 are switched from a turn-off state to a turn-on state in response to the semiconductor device exiting the power-down mode and entering the active mode, if the logic elements 3 and 4 in the semiconductor device start to operate before a sufficient time elapses after switching to the turn-on state, a power gating error may occur.

That is to say, as the PMOS transistor 1 and the NMOS transistor 2 are switched to a turn-on state, the first logic element 3 is coupled to the line 5 to which the power voltage VDD is supplied, through the virtual power voltage line 6, and the second logic element 4 is coupled to the line 8 to which the ground voltage VSS is supplied, through the virtual ground voltage line 7, but, when a wait time is insufficient and thus the virtual power voltage line 6 and the virtual ground voltage line 7 are in a floating state, floating current may be generated and the logic elements 3 and 4 may operate abnormally.

Therefore, the semiconductor device in accordance with an embodiment of the disclosure may control a logic level of the select signal PG or PGB to transition before entry to the active mode (or before exit from the power-down mode), thereby preventing the virtual power voltage line 6 and the virtual ground voltage line 7 from being in a floating state. The select signal PG and PGB may respectively control the turn-on/turn-off of the PMOS transistor 1 and the NMOS transistor 2 in the circuit to which the zigzag power gating technique is applied.

Figure 2:
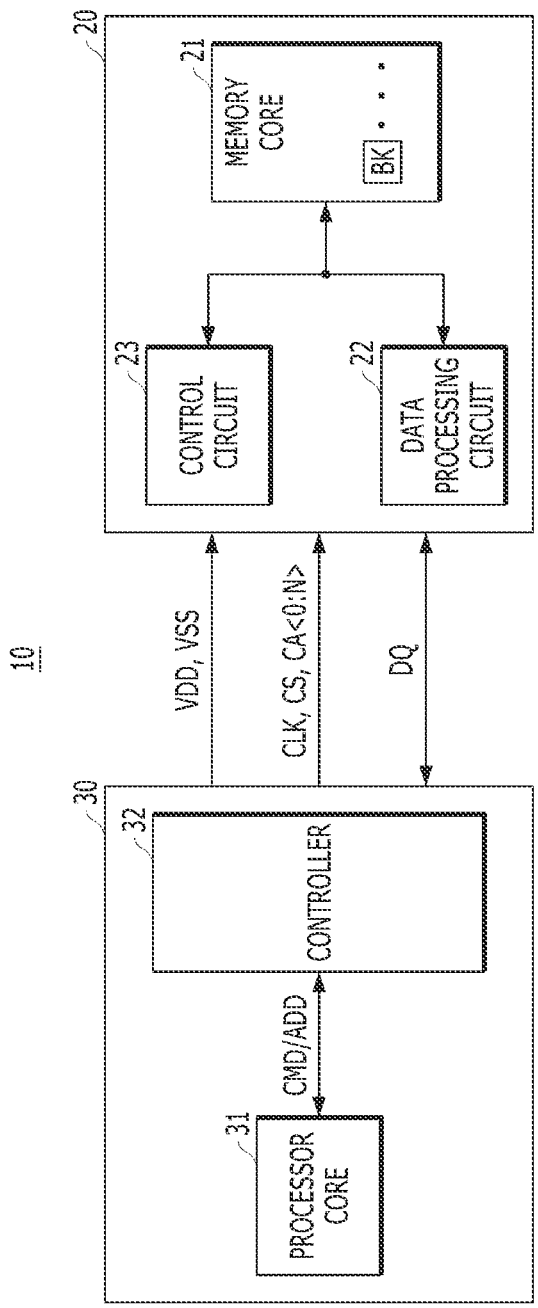
FIG. 2 is a diagram illustrating a configuration of an electronic system including a semiconductor device in accordance with an embodiment of the disclosure.

FIG. 2 is a diagram illustrating a configuration of an electronic system including a semiconductor device in accordance with an embodiment of the disclosure.

Referring to FIG. 2, the electronic system 10 may include a semiconductor device 20 and a processor 30. The semiconductor device 20 may include a memory device, as well as various other types of electronic semiconductor devices.

The electronic system 10 may be configured in the form of an SoC (system-on-chip). The processor 30 may include a CPU (central processing unit) or a GPU (graphic processing unit).

The processor 30 may include a processor core 31 and a controller 32.

The processor core 31 may provide to the controller 32 various commands CMD and addresses ADD for controlling the semiconductor memory device 20.

The controller 32 may control the semiconductor memory device 20 by providing a power voltage VDD and a ground voltage VSS, a chip select signal CS and a command/address signal CA<0:N> to the semiconductor memory device 20 according to the commands CMD and the addresses ADD provided from the processor core 31.

The controller 32 may transmit data DQ to, and received data DQ from, the semiconductor memory device 20.

The semiconductor memory device 20 may include a memory core 21, a data processing circuit 22 and a control circuit 23.

The memory core 21 may include a plurality of unit memory regions, for example, memory banks BK, and circuits for inputting data to, and outputting data from, the memory banks BK.

The data processing circuit 22 may perform an operation related with data input/output between the memory core 21 and the controller 32.

The control circuit 23 may control a data read/write operation and a power gating-related operation of the semiconductor memory device 20 according to the chip select signal CS and the command/address signal CA<0:N> provided from the controller 32 of the processor 30.

Figure 3:
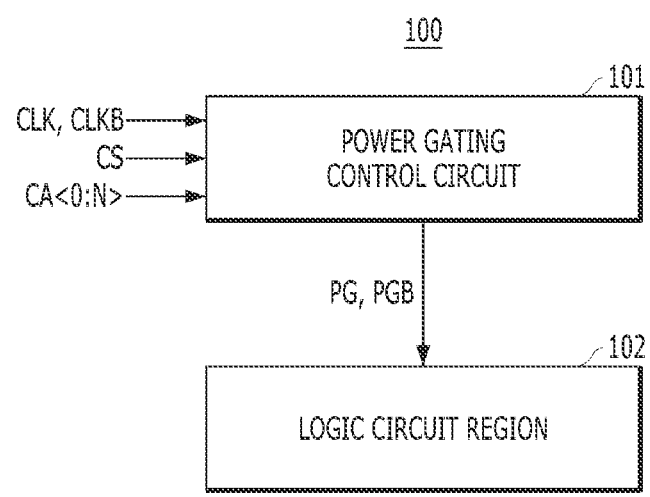
FIG. 3 is a diagram illustrating a configuration of a power gating system applied to a semiconductor device in accordance with an embodiment of the disclosure.

FIG. 3 is a diagram illustrating the configuration of a power gating system applied to the semiconductor device in accordance with an embodiment of the disclosure.

The power gating system 100 may be configured in the semiconductor memory device 20 of FIG. 2, for example.

Referring to FIG. 3, the power gating system 100 may include a power gating control circuit 101 and a logic circuit region 102.

The logic circuit region 102 included in the power gating system 100 may include the logic elements 3 and 4 and the circuit that supplies, by applying the zigzag power gating technique, power to the logic elements 3 and 4 in the semiconductor device described above with reference to FIG. 1.

Thus, the logic elements 3 and 4 in the logic circuit region 102 output signals that have logic levels fixed to specific values in the power-down mode of the semiconductor memory device 20.

As described above with reference to FIG. 1, power supply to the logic elements 3 and 4 in the logic circuit region 102 may be cut off depending on application of the select signals PG and PGB to the gates of transistors 1 and 2, respectively.

Therefore, the power gating control circuit 101 included in the power gating system 100 for controlling the power gating operation of the logic circuit region 102 may determine whether to enter the power-down mode, depending on a chip select signal CS, a command/address signal CA<0: N> and a clock signal CLK, and may generate the select signal PG or PGB at a certain logic level depending on whether or not the power-down mode is entered.

Figure 4:
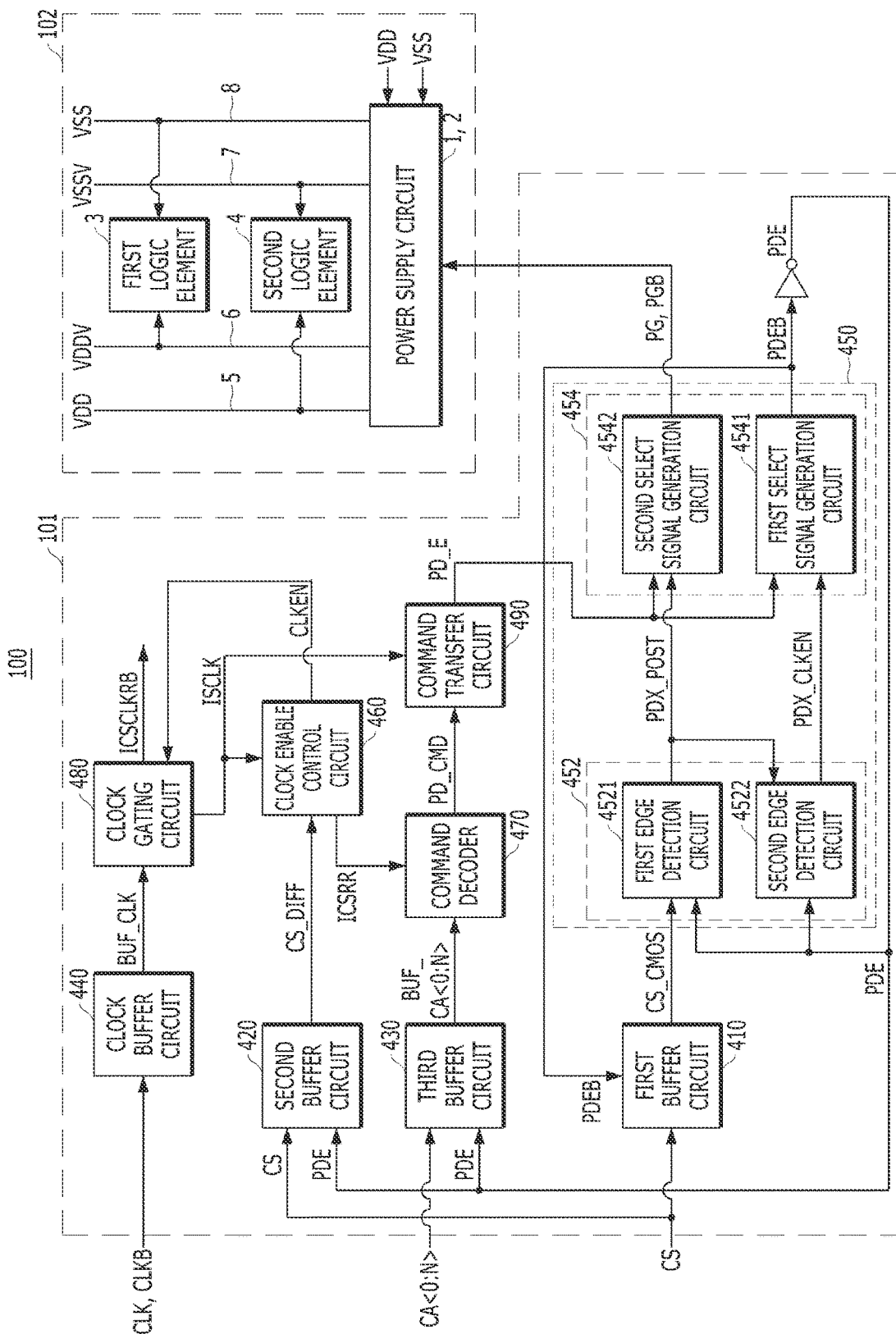
FIG. 4 is a diagram illustrating a first embodiment of the power gating system in accordance with an embodiment of the disclosure.

FIG. 4 is a diagram illustrating a first embodiment of the power gating system in accordance with an embodiment of the disclosure.

Referring to FIG. 4, detailed configurations of the power gating control circuit 101 and the logic circuit region 102 included in the power gating system 100 according to the first embodiment of the power gating system 100 are illustrated.

First, the power gating control circuit 101 may include a first buffer circuit 410, a second buffer circuit 420, a third buffer circuit 430, a clock buffer circuit 440, a select control circuit 450, a clock enable control circuit 460, a command decoder 470, a clock gating circuit 480, and a command transfer circuit 490. The select control circuit 450 may include a detection circuit 452 and a select signal generation circuit 454. The detection circuit 452 may include a first edge detection circuit 4521 and a second edge detection circuit 4522. The select signal generation circuit 454 may include a first select signal generation circuit 4541 and a second select signal generation circuit 4542.

Further, the logic circuit region 102 may include logic elements 3 and 4 and a circuit (collectively, elements 1, 2, 5, 6, 7 and 8) which supplies power to the logic elements 3 and 4. The circuit which supplies power may include a power supply circuit 1 and 2, a line 5 to which a power voltage VDD is supplied, a virtual power voltage (VDDV) line 6, a virtual ground voltage (VSSV) line 7, and a line 8 to which a ground voltage VSS is supplied.

In detail, the first buffer circuit 410 may receive a chip select signal CS in the power-down mode in response to a first select signal PDEB. In other words, the first buffer circuit 410 may output a first chip select signal CS_CMOS by buffering the chip select signal CS during a period in which the first select signal PDEB is set to a second logic level, and may be disabled during a period in which the first select signal PDEB is set to a first logic level. For example, since the first buffer circuit 410 operates during a period in which a negative first select signal PDEB has the first logic level and does not operate during a period in which the negative first select signal PDEB has the second logic level, the first buffer circuit 410 may output the first chip select signal CS_CMOS in the power-down mode, and may not receive the chip select signal CS in the active mode. The chip select signal CS or the first chip select signal CS_C-MOS provided to the first buffer circuit 410 in the power-down mode may direct the power gating system 100 to exit the power-down mode and enter the active mode. According to an embodiment of the present invention, a logic level of a second select signal PG or PGB transitions, at the rising edge of the first chip select signal CS_CMOS, to turn on the PMOS transistor 1 and the NMOS transistor 2 in the logic circuit region 102. According to an embodiment of the present invention, a logic level of the first select signal PDE or PDEB transitions, at the falling edge following the rising edge of the first chip select signal CS_CMOS, to control the power gating system 100 to exit from the power-down mode and enter the active mode. According to an embodiment, the power gating system 100 may exit the power-down mode and enter the active mode after the PMOS transistor 1 and the NMOS transistor 2 in the logic circuit region 102 are turned on. Therefore, according to an embodiment, a sufficient time may be secured to prevent the virtual power voltage line 6 and the virtual ground voltage line 7 from floating and thus prevent the logic elements 3 and 4 from operating abnormally.

For reference, the 'first logic level' is opposite of the 'second logic level'. That is, one of the two logic levels is 'high' and the other is 'low'. In this disclosure, a positive select signal is indicative of one of the two logic levels and a negative select signal is indicative of the other logic level. For example, a positive first select signal PDE or PDEB has the first, e.g., 'high', logic level and a negative first select signal PDE or PDEB has the second, e.g., 'low', logic level.

The second buffer circuit 420 may receive the chip select signal CS in the active mode in response to the first select signal PDE or PDEB. In other words, the second buffer circuit 420 may output a second chip select signal CS_DIFF by buffering the chip select signal CS, received from an external source, during a period in which the first select signal PDE is set to the first logic level, and may be disabled during a period in which the first select signal PDE is set to the second logic level. For example, since the second buffer circuit 420 operates during a period in which a positive first select signal PDE has the first logic level and does not operate during a period in which the positive first select signal PDE has the second logic level, the second buffer circuit 420 may output the second chip select signal CS_DIFF by receiving the chip select signal CS in the active mode, and may not receive the chip select signal CS in the power-down mode.

For reference, although not specifically illustrated in the drawing, the first buffer circuit 410 may be implemented by a CMOS (complementary metal oxide semiconductor). The second buffer circuit 420 may be implemented by a differential amplifier.

The third buffer circuit 430 may receive a command/address signal CA<0:N> in the active mode in response to the first select signal PDE. For example, since the third buffer circuit 430 operates during a period in which the positive first select signal PDE has the first logic level and does not operate during a period in which the positive first select signal PDE has the second logic level, the third buffer circuit 430 may receive the command/address signal CA<0:

N> in the active mode, and may not receive the command/address signal CA<0:N> in the power-down mode.

The clock buffer circuit 440 may receive a clock CLK and CLKB. Namely, the clock buffer circuit 440 may receive the clock CLK and CLKB in both the active mode and the power-down mode.

The clock gating circuit 480 may generate a first internal clock ISCLK which toggles in both the active mode and the power-down mode and a second internal clock ICSCLKRB which toggles in the active mode and does not toggle, by being fixed to a specific logic level, in the power-down mode, in response to a clock BUF_CLK received through the clock buffer circuit 440 and a clock enable signal CLKEN.

In the power-down mode, the select control circuit 450 may transition a logic level of a second select signal PG, PGB at a first edge of the first chip select signal CS_CMOS received through the first buffer circuit 410, and then, may transition a logic level of the first select signal PDE and PDEB at a second edge, immediately following the first edge, of the first chip select signal CS_CMOS. In this way, by transitioning a logic level of the first select signal PDE, PDEB at the second edge of the first chip select signal CS_CMOS, the select control circuit 450 may transition a logic level of the second select signal PG, PGB before entry to the active mode (or before exit from the power-down mode), that is, when the first edge is generated in the first chip select signal CS_CMOS. The select control circuit 450 may maintain a reset state in the active mode, so as not to malfunction in the active mode. For example, the select control circuit 450 may not malfunction in the active mode, by maintaining the reset state during a period in which the positive first select signal PDE, PDEB has the first logic level.

The clock enable control circuit 460 may generate a command select code signal ICSRR and the clock enable signal CLKEN in response to the second chip select signal CS_DIFF received through the second buffer circuit 420 in the active mode and the first internal clock ISCLK generated in the clock gating circuit 480.

The command decoder 470 may generate a plurality of commands (not illustrated) in response to a command/address signal BUF_CA<0:N> received through the third buffer circuit 430 in the active mode and the command select code signal ICSRR generated in the clock enable control circuit 460. In particular, the command decoder 470 may generate a power-down command PD_CMD for determining whether to enter the power-down mode.

The command transfer circuit 490 may transfer a power-down command PD_E to the select control circuit 450 by synchronizing the power-down command PD_CMD, generated in the command decoder 470, with the first internal clock ISCLK generated in the clock gating circuit 480.

Further, as described above with reference to FIG. 1, the logic circuit region 102 may include the logic elements 3 and 4 and the circuit (collectively, elements 1, 2, 5, 6, 7 and 8) which supplies power to the logic elements 3 and 4.

As described above with reference to FIG. 1, the circuit which supplies power may include the PMOS transistor 1, the NMOS transistor 2, the line 5 to which the power voltage VDD is supplied, the virtual power voltage (VDDV) line 6, the virtual ground voltage (VSSV) line 7, and the line 8 to which the ground voltage VSS is supplied. In other words, the power supply circuit 1, 2 illustrated in FIG. 4 comprises the PMOS transistor 1 and the NMOS transistor 2 which selectively supply the external power VDD or VSS to the logic elements 3 and 4 in response to the second select signal PG or PGB inputted from the power gating control circuit 101.

Accordingly, the power supply circuit 1 and 2 may supply the external power VDD and VSS to the logic elements 3 and 4 by allowing coupling of the line 5 to which the power voltage VDD is supplied and the virtual power voltage (VDDV) line 6 and allowing coupling of the line 8 to which the ground voltage VSS is supplied and the virtual ground voltage (VSSV) line 7, during a period in which the second select signal PG or PGB is set to the first logic level. Conversely, the power supply circuit 1 and 2 may not supply the external power VDD and VSS to the logic elements 3 and 4 by cutting off coupling of the line 5 to which the power voltage VDD is supplied and the virtual power voltage (VDDV) line 6 and cutting off coupling of the line 8 to which the ground voltage VSS is supplied and the virtual ground voltage (VSSV) line 7, during a period in which the second select signal PG or PGB is set to the second logic level. Setting the second select signal PG or PGB to the first logic level may mean that a positive second select signal PG or PGB is set to the first logic level and a negative second select signal PG or PGB is set to the second logic level. Conversely, setting the second select signal PG or PGB to the second logic level may mean that the positive second select signal PG or PGB is set to the second logic level and the negative second select signal PG or PGB is set to the first logic level.

In further detail, the select control circuit 450 may include the detection circuit 452 and the select signal generation circuit 454.

The detection circuit 452 may detect an edge of the first chip select signal CS_CMOS in the power-down mode. The detection circuit 452 may maintain a reset state in the active mode, so as not to malfunction in the active mode. For example, the detection circuit 452 may not malfunction in the active mode, by maintaining the reset state during a period in which the positive first select signal PDE or PDEB has the first logic level.

The select signal generation circuit 454 may generate the first select signal PDE or PDEB and the second select signal PG or PGB in response to output signals PDX_POST and PDX_CLKEN of the detection circuit 452 and the power-down command PD_E transferred through the command transfer circuit 490. According to the power-down command PD_E, the power gating system 100 may enter the power-down mode.

The detection circuit 452 may include the first edge detection circuit 4521 and the second edge detection circuit 4522.

The first edge detection circuit 4521 may generate a first edge detection signal PDX_POST by detecting a first edge of the first chip select signal CS_CMOS in the power-down mode. The first edge detection circuit 4521 may maintain a reset state in the active mode, so as not to malfunction in the active mode. For example, the first edge detection circuit 4521 may not malfunction in the active mode, by maintaining the reset state during a period in which the positive first select signal PDE or PDEB has the first logic level.

The second edge detection circuit 4522 may generate a second edge detection signal PDX_CLKEN by detecting a second edge of the first chip select signal CS_CMOS in response to the first edge detection signal PDX_POST in the power-down mode. The second edge detection circuit 4522 may maintain a reset state in the active mode, so as not to malfunction in the active mode. For example, the second edge detection circuit 4522 may not malfunction in the active mode, by maintaining the reset state during a period in which the positive first select signal PDE or PDEB has the first logic level.

For reference, the 'first edge' and the 'second edge' may mean edges which are opposite to each other in terms of rising and falling. For example, in the case where the first edge is a rising edge which transitions from a logic 'low' level to a logic 'high' level, the second edge may be a falling edge which transitions from a logic 'high' level to a logic 'low' level. Conversely, in the case where the first edge is a falling edge which transitions from a logic 'high' level to a logic 'low' level, the second edge may be a rising edge which transitions from a logic 'low' level to a logic 'high' level.

The select signal generation circuit 454 may include the first select signal generation circuit 4541 and the second select signal generation circuit 4542.

The first select signal generation circuit 4541 may set the first select signal PDE or PDEB to the first logic level in response to the second edge detection signal PDX_CLKEN generated in the second edge detection circuit 4522. Setting the first select signal PDE or PDEB to the first logic level may mean that the positive first select signal PDE or PDEB is set to the first logic level and the negative first select signal PDE or PDEB is set to the second logic level.

The second select signal generation circuit 4542 may set the second select signal PG or PGB to the first logic level in response to the first edge detection signal PDX_POST generated in the first edge detection circuit 4521. Setting the second select signal PG or PGB to the first logic level may mean that the positive second select signal PG or PGB is set to the first logic level and the negative second select signal PG or PGB is set to the second logic level.

The select control circuit 450 may transition the first select signal PDE or PDEB in response to the power-down command PD_CMD in the active mode, and then, may transition the second select signal PG or PGB a set amount of time after transition of the first select signal PDE or PDEB. In this way, by transitioning the logic level of the first select signal PDE or PDEB in response to the power-down command PD_CMD, the select control circuit 450 may transition the logic level of the second select signal PG or PGB a set amount of time after entry to the power-down mode (or exit from the active mode).

In further detail, the first select signal generation circuit 4541 included in the select control circuit 450 may set the first select signal PDE or PDEB to the second logic level in response to the power-down command PD_CMD. Setting the first select signal PDE or PDEB to the second logic level may mean that the positive first select signal PDE or PDEB is set to the second logic level and the negative first select signal PDE or PDEB is set to the first logic level.

The second select signal generation circuit 4542 included in the select control circuit 450 may set, in response to the power-down command PD_CMD, the second select signal PG or PGB to the second logic level a set amount of time after the first select signal PDE or PDEB is set to the second logic level. Setting the second select signal PG or PGB to the second logic level may mean that the positive second select signal PG or PGB is set to the second logic level and the negative second select signal PG or PGB is set to the first logic level.

Figure 5:
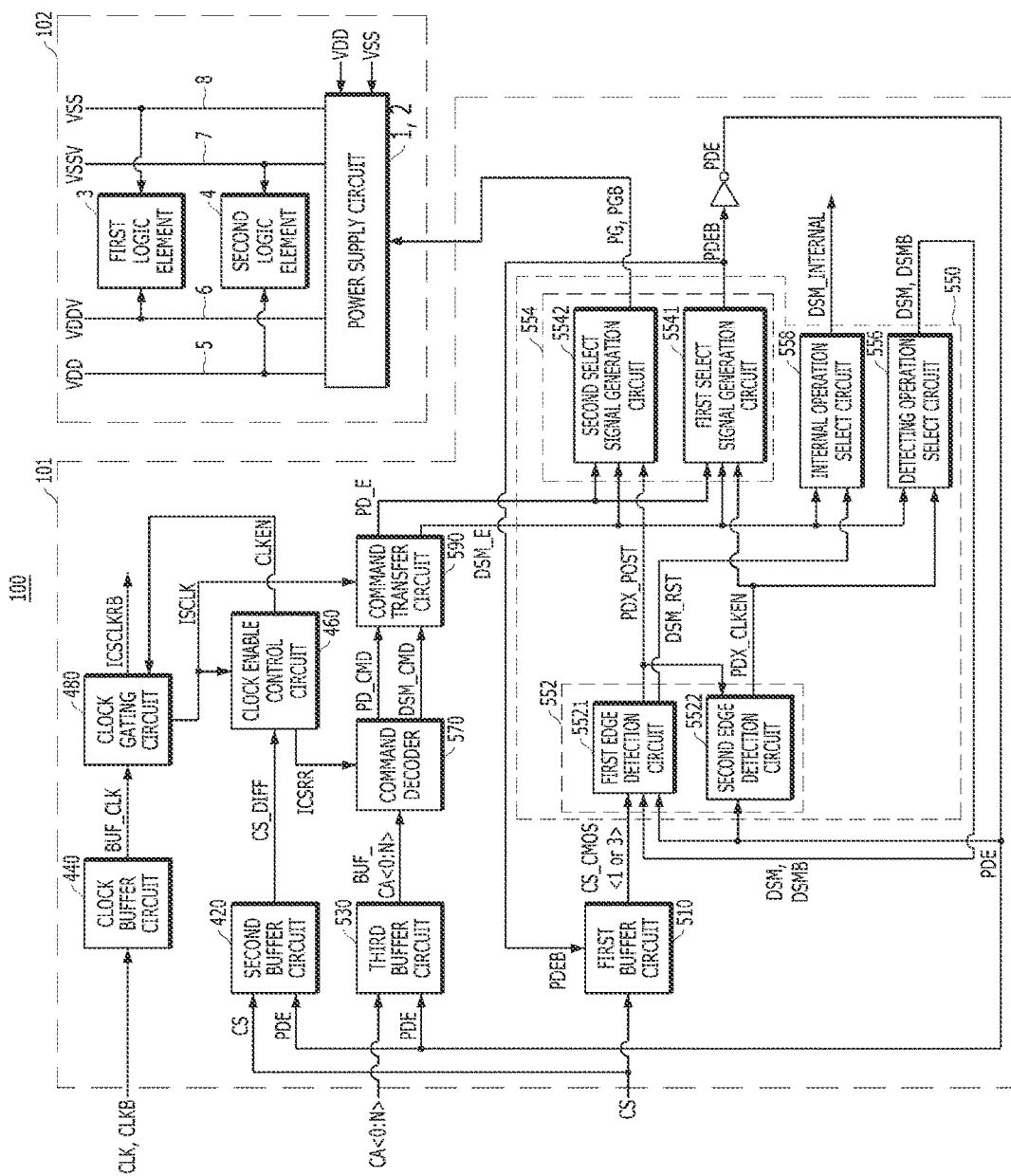
FIG. 5 is a diagram illustrating a second embodiment of the power gating system in accordance with an embodiment of the disclosure.

FIG. 5 is a diagram illustrating a second embodiment of the power gating system in accordance with an embodiment of the disclosure.

Referring to FIG. 5, detailed configurations of the power gating control circuit 101 and the logic circuit region 102 in the power gating system 100 according to the second embodiment of the power gating system 100 are illustrated.

First, the power gating control circuit 101 may include a first buffer circuit 510, a second buffer circuit 420, a third buffer circuit 530, a clock buffer circuit 440, a select control circuit 550, a clock enable control circuit 460, a command decoder 570, a clock gating circuit 480, and a command transfer circuit 590. The select control circuit 550 may include a detection circuit 552, a select signal generation circuit 554, a detecting operation select circuit 556, and an internal operation select circuit 558. The detection circuit 552 may include a first edge detection circuit 5521 and a second edge detection circuit 5522. The select signal generation circuit 554 may include a first select signal generation circuit 5541 and a second select signal generation circuit 5542.

Further, the logic circuit region 102 may include logic elements 3 and 4 and a circuit (collectively, elements 1, 2, 5, 6, 7 and 8) which supplies power to the logic elements 3 and 4. The circuit which supplies power may include a power supply circuit 1 and 2, a line 5 to which a power voltage VDD is supplied, a virtual power voltage (VDDV) line 6, a virtual ground voltage (VSSV) line 7, and a line 8 to which a ground voltage VSS is supplied.

In detail, the first buffer circuit 510 may receive a chip select signal CS in a first power-down mode or a second power-down mode in response to a first select signal PDE or PDEB. In other words, the first buffer circuit 510 may output a first chip select signal CS_CMOS1 or a third chip select signal CS_CMOS3 by buffering the chip select signal CS during a period in which the first select signal PDE or PDEB is set to a second logic level, and may be disabled during a period in which the first select signal PDE or PDEB is set to a first logic level. For example, since the first buffer circuit 510 operates during a period in which a negative first select signal PDE or PDEB has the first logic level and does not operate during a period in which the negative first select signal PDE or PDEB has the second logic level, the first buffer circuit 510 may output the third chip select signal CS_CMOS3 or the first chip select signal CS_CMOS1 in the first power-down mode or the second power-down mode, and may not receive the chip select signal CS in the active mode. The chip select signal CS or the first chip select signal CS_CMOS1 provided to the first buffer circuit 410 in the first or second power-down mode may direct the power gating system 100 to exit the power-down mode and enter the active mode. According to an embodiment of the present invention, a logic level of a second select signal PG or PGB transitions, at the rising edge of the first chip select signal CS_CMOS1, to turn on the PMOS transistor 1 and the NMOS transistor 2 in the logic circuit region 102. According to an embodiment of the present invention, a logic level of the first select signal PDE or PDEB transitions, at the failing edge following the rising edge of the first chip select signal CS_CMOS1, to control the power gating system 100 to exit from the first or second power-down mode and enter the active mode. According to an embodiment, the power gating system 100 may exit from the first or second power-down mode and enter the active mode after the PMOS transistor 1 and the NMOS transistor 2 in the logic circuit region 102 are turned on. Therefore, according to an embodiment, a sufficient time may be secured to prevent the virtual power voltage line 6 and the virtual ground voltage line 7 from floating and prevent the logic elements 3 and 4 from operating abnormally.

For reference, the 'first logic level' and the 'second logic level' may be opposite logic levels. For example, in the case where the first logic level is a logic 'high' level, the second logic level may be a logic 'low' level. Conversely, in the case where the first logic level is a logic 'low' level, the second logic level may be a logic 'high' level. In this disclosure, a positive select signal has one of two logic levels and a negative select signal has the other logic level, when the select signal is indicated as having a specific logic level. For example, the positive first select signal PDE or PDEB has the first logic level and the negative first select signal PDE or PDEB has the second logic level.

The second buffer circuit 420 may receive the chip select signal CS in the active mode in response to the first select signal PDE or PDEB. In other words, the second buffer circuit 420 may output a second chip select signal CS_DIFF by buffering the chip select signal CS, received from an outside, during a period in which the first select signal PDE or PDEB is set to the first logic level, and may be disabled during a period in which the first select signal PDE or PDEB is set to the second logic level. For example, since the second buffer circuit 420 operates during a period in which a positive first select signal PDE or PDEB has the first logic level and does not operate during a period in which the positive first select signal PDE or PDEB has the second logic level, the second buffer circuit 420 may output the second chip select signal CS_DIFF by receiving the chip select signal CS in the active mode, and may not receive the chip select signal CS in the first power-down mode or the second power-down mode.

For reference, although not specifically illustrated in the drawing, the first buffer circuit 510 may be implemented by a CMOS (complementary metal oxide semiconductor). The second buffer circuit 420 may be implemented by a differential amplifier.

The third buffer circuit 530 may receive a command/address signal CA<0:N> in the active mode in response to the first select signal PDE or PDEB. For example, since the third buffer circuit 530 operates during a period in which the positive first select signal PDE or PDEB has the first logic level and does not operate during a period in which the positive first select signal PDE or PDEB has the second logic level, the third buffer circuit 530 may receive the command/address signal CA<0:N> in the active mode, and may not receive the command/address signal CA<0:N> in the first power-down mode or the second power-down mode.

The clock buffer circuit 440 may receive a clock CLK and CLKB. Namely, the clock buffer circuit 440 may receive the clock CLK and CLKB in all of the active mode, the first power-down mode and the second power-down mode.

The clock gating circuit 480 may generate a first internal clock ISCLK which toggles in all of the active mode, the first power-down mode and the second power-down mode and a second internal clock ICSCLKRB which toggles in the active mode and does not toggle, by being fixed to a specific logic level, in the first power-down mode or the second power-down mode, in response to a clock BUF_CLK received through the clock buffer circuit 440 and a clock enable signal CLKEN.

In the first power-down mode or in the second power-down mode, the select control circuit 550 may transition a logic level of a second select signal PG or PGB at a first edge of the first chip select signal CS_CMOS1 received through the first buffer circuit 510, and then, may transition a logic level of the first select signal PDE or PDEB at a following second edge of the first chip select signal CS_CMOS1. In this way, by transitioning a logic level of the first select signal PDE or PDEB at the second edge of the first chip select signal CS_CMOS1, the select control circuit 550 may transition a logic level of the second select signal PG or PGB before entry to the active mode (or exit from the first power-down mode or exit from the second power-down mode), that is, when the first edge is generated in the first chip select signal CS_CMOS1. The select control circuit 550 may maintain a reset state in the active mode, so as not to malfunction in the active mode. For example, the select control circuit 550 may not malfunction in the active mode, by maintaining the reset state during a period in which the positive first select signal PDE or PDEB has the first logic level.

In further detail, the select control circuit 550 may check a number of times the chip select signal CS received through the first buffer circuit 510 is received in the first power-down mode or in the second power-down mode, and may receive the first chip select signal CS_CMOS1 or the third chip select signal CS_CMOS3 depending on a checking result. For example, the select control circuit 550 may receive the chip select signal CS, first received through the first buffer circuit 510 in the first power-down mode, as the first chip select signal CS_CMOS1. Also, the select control circuit 550 may receive the chip select signal CS, first received through the first buffer circuit 510 in the second power-down mode, as the third chip select signal CS_CMOS3, and may receive the chip select signal CS, second received, as the first chip select signal CS_CMOS1.

Namely, the select control circuit 550 may determine whether the chip select signal CS received through the first buffer circuit 510 in the first power-down mode or in the second power-down mode is to be used as the first chip select signal CS_CMOS1 or the third chip select signal CS_CMOS3. For reference, the signals CS_CMOS1 and CS_CMOS3 which are outputted by buffering the chip select signal CS received through the first buffer circuit 510 may have substantially the same characteristic. The output signal of the first buffer circuit 510 in FIG. 5 is illustrated as being dividedly outputted as the first chip select signal CS_CMOS1 and the third chip select signal CS_CMOS3 by way of example.

The clock enable control circuit 460 may generate a command select code signal ICSRR and the clock enable signal CLKEN in response to the second chip select signal CS_DIFF received through the second buffer circuit 420 in the active mode and the first internal clock ISCLK generated in the clock gating circuit 480.

The command decoder 570 may generate a plurality of commands (not illustrated) in response to a command/address signal BUF_CA<0:N> received through the third buffer circuit 530 in the active mode and the command select code signal ICSRR generated in the clock enable control circuit 460. In particular, the command decoder 570 may generate a first power-down command PD_CMD for determining whether to enter the first power-down mode and a second power-down command DSM_CMD for determining whether to enter the second power-down mode.

The command transfer circuit 590 may transfer signals PD_E and DSM_E to the select control circuit 550 by synchronizing the first power-down command PD_CMD and the second power-down command DSM_CMD, generated in the command decoder 570, with the first internal clock ISCLK generated in the clock gating circuit 480.

According to the power-down command PD_E, the power gating system 100 may enter the first power-down mode. According to the power-down command DSM_E, the power gating system 100 may enter the second power-down mode.

Further, as described above with reference to FIG. 1, the logic circuit region 102 may include the logic elements 3 and 4 and the circuit 1, 2, 5, 6, 7 and 8 which supplies power to the logic elements 3 and 4.

As described above with reference to FIG. 1, the circuit 1, 2, 5, 6, 7 and 8 which supplies power may include the PMOS transistor 1, the NMOS transistor 2, the line 5 to which the power voltage VDD is supplied, the virtual power voltage (VDDV) line 6, the virtual ground voltage (VSSV) line 7, and the line 8 to which the ground voltage VSS is supplied. In other words, the power supply circuit 1, 2 illustrated in FIG. 5 comprises the PMOS transistor 1 and the NMOS transistor 2 which selectively supply the external power VDD or VSS to the logic elements 3 and 4 in response to the second select signal PG or PGB inputted from the power gating control circuit 101.

Accordingly, the power supply circuit 1 and 2 may supply the external power VDD and VSS to the logic elements 3 and 4 by allowing coupling of the line 5 to which the power voltage VDD is supplied and the virtual power voltage (VDDV) line 6 and allowing coupling of the line 8 to which the ground voltage VSS is supplied and the virtual ground voltage (VSSV) line 7, during a period in which the second select signal PG or PGB is set to the first logic level. Conversely, the power supply circuit 1 and 2 may not supply the external power VDD and VSS to the logic elements 3 and 4 by cutting off coupling of the line 5 to which the power voltage VDD is supplied and the virtual power voltage (VDDV) line 6 and cutting off coupling of the line 8 to which the ground voltage VSS is supplied and the virtual ground voltage (VSSV) line 7, during a period in which the second select signal PG or PGB is set to the second logic level. Setting the second select signal PG or PGB to the first logic level may mean that a positive signal PG of the second select signal PG or PGB is set to the first logic level and a negative second select signal PG or PGB is set to the second logic level. Conversely, setting the second select signal PG or PGE to the second logic level may mean that the positive signal PG of the second select signal PG or PGB is set to the second logic level and the negative second select signal PG or PGB is set to the first logic level.

In further detail, the select control circuit 550 may include the detection circuit 552, the select signal generation circuit 554, the detecting operation select circuit 556, and the internal operation select circuit 558.

The detection circuit 552 may detect an edge of the first chip select signal CS_CMOS1 in the first power-down mode. Also, the detection circuit 552 may detect an edge of the third chip select signal CS_CMOS3 and an edge of the first chip select signal CS_CMOS1 in the second power-down mode. The detection circuit 552 may maintain a reset state in the active mode, so as not to malfunction in the active mode. For example, the detection circuit 552 may not malfunction in the active mode, by maintaining the reset state during a period in which the positive first select signal PDE or PDEB has the first logic level.

The select signal generation circuit 554 may generate the first select signal PDE or PDEB and the second select signal PG or PGB in response to output signals PDX_POST and PDX_CLKEN of the detection circuit 552, and the first power-down command PD_CMD, corresponding to the first power-down mode, and the second power-down command DSM_CMD, corresponding to the second power-down mode, which are transferred through the command transfer circuit 590.

The detection circuit 552 may include the first edge detection circuit 5521 and the second edge detection circuit 5522.

The first edge detection circuit 5521 may generate a first edge detection signal PDX_POST by detecting a first edge of the first chip select signal CS_CMOS1 in the first power-down mode and in the second power-down mode. The first edge detection circuit 5521 may generate a third edge detection signal DSM_RST by detecting a first edge of the third chip select signal CS_CMOS3 in the second power-down mode. The first edge detection circuit 5521 may maintain a reset state in the active mode, so as not to malfunction in the active mode. For example, the first edge detection circuit 5521 may not malfunction in the active mode, by maintaining the reset state during a period in which the positive first select signal PDE or PDEB has the first logic level.

The second edge detection circuit 5522 may generate a second edge detection signal PDX_CLKEN by detecting a second edge of the first chip select signal CS_CMOS1 in response to the first edge detection signal PDX_POST in the first power-down mode and in the second power-down mode. The second edge detection circuit 5522 may maintain a reset state in the active mode, so as not to malfunction in the active mode. For example, the second edge detection circuit 5522 may not malfunction in the active mode, by maintaining the reset state during a period in which the positive first select signal PDE or PDEB has the first logic level.

For reference, the 'first edge' and the 'second edge' may mean edges which are opposite to each other in terms of rising and falling. For example, in the case where the first edge is a rising edge which transitions from a logic 'low' level to a logic 'high' level, the second edge may be a falling edge which transitions from a logic 'high' level to a logic 'low' level. Conversely, in the case where the first edge is a falling edge which transitions from a logic 'high' level to a logic 'low' level, the second edge may be a rising edge which transitions from a logic 'low' level to a logic 'high' level.

The select signal generation circuit 554 may include the first select signal generation circuit 5541 and the second select signal generation circuit 5542.

The first select signal generation circuit 5541 may set the first select signal PDE or PDEB to the first logic level in response to the second edge detection signal PDX_CLKEN generated in the second edge detection circuit 5522. Setting the first select signal PDE or PDEB to the first logic level may mean that the positive first select signal PDE or PDEB is set to the first logic level and the negative first select signal PDE or PDEB is set to the second logic level.

The second select signal generation circuit 5542 may set the second select signal PG or PGB to the first logic level in response to the first edge detection signal PDX_POST generated in the first edge detection circuit 5521. Setting the second select signal PG or PGB to the first logic level may mean that a positive signal PG of the second select signal PG or PGB is set to the first logic level and a negative second select signal PG or PGB is set to the second logic level.

The select control circuit 550 may transition the first select signal PDE or PDEB in response to the first power-down command PD_CMD or the second power-down command DSM_CMD in the active mode, and then, may transition the second select signal PG or PGB a set amount of time after the change of the first select signal PDE or PDEB. In this way, by transitioning the logic level of the first select signal PDE or PDEB in response to the first power-down command PD_CMD or the second power-down command DSM_CMD, the select control circuit 550 may transition the logic level of the second select signal PG or PGB a set amount of time after entry to the first power-down mode or the second power-down mode (or exit from the active mode).

In further detail, the first select signal generation circuit 5541 included in the select control circuit 550 may set the first select signal PDE or PDEB to the second logic level in response to the first power-down command PD_CMD or the second power-down command DSM_CMD. Setting the first select signal PDE or PDEB to the second logic level may mean that the positive first select signal PDE or PDEB is set to the second logic level and the negative first select signal PDE or PDEB is set to the first logic level.

The second select signal generation circuit 5542 included in the select control circuit 550 may set, in response to the first power-down command PD_CMD or the second power-down command DSM_CMD, the second select signal PG or PGB to the second logic level a set amount of time after the first select signal PDE or PDEB is set to the second logic level. Setting the second select signal PG or PGB to the second logic level may mean that the positive signal PG of the second select signal PG or PGB is set to the second logic level and the negative second select signal PG or PGB is set to the first logic level.

The detecting operation select circuit 556 included in the select control circuit 550 may generate a detection select signal DSM which is initialized to a first state. The detecting operation select circuit 556 may transition the detection select signal DSM to a second state in response to the second power-down command DSM_CMD, and then, may transition the detection select signal DSM to the first state in response to the second edge detection signal PDX_CLKEN.

The detection circuit 552 included in the select control circuit 550 may perform an operation in the first power-down mode, in response to the detection select signal DSM of the first state. That is to say, when the detection select signal DSM is in the first state, the detection circuit 552 may recognize the chip select signal CS, first received through the first buffer circuit 510, as the first chip select signal CS_CMOS1 and may detect an edge thereof.

The detection circuit 552 included in the select control circuit 550 may perform an operation in the second power-down mode, in response to the detection select signal DSM of the second state. That is to say, when the detection select signal DSM is in the second state, the detection circuit 552 may recognize the chip select signal CS, first received through the first buffer circuit 510, as the third chip select signal CS_CMOS3 and may detect an edge thereof, and may recognize the chip select signal CS, second received through the first buffer circuit 510, as the first chip select signal CS_CMOS1 and may detect an edge thereof.

For reference, the 'first state' and the 'second state' may mean states which have opposite logic levels. For example, in the case where the first state means a logic 'high' level, the second state may mean a logic 'low' level. Conversely, in the case where the first state means a logic 'low' level, the second state may mean a logic 'high' level.

The internal operation select circuit 558 included in the select control circuit 550 may generate an internal select signal DSM_INTERNAL which is initialized to a third state. The internal operation select circuit 558 may transition the internal select signal DSM_INTERNAL to a fourth state in response to the second power-down command DSM_CMD, and then, may transition the internal select signal DSM_INTERNAL to the third state in response to the third edge detection signal DSM_RST.

The semiconductor memory device 20 described above with reference to FIG. 2 may further include an internal circuit (not illustrated), which is enabled in response to the internal select signal DSM_INTERNAL of the third state and is disabled in response to the internal select signal DSM_INTERNAL of the fourth state. In other words, the internal circuit may be included in the semiconductor memory device 20 described above with reference to FIG. 2, in a form distinguished from the power gating system 100 described above with reference to FIG. 3. For example, the internal circuit may be a circuit which generates a high power voltage (VPP) in the memory banks BK included in the memory core 21 described above with reference to FIG. 2.

For reference, the 'third state' and the 'fourth state' may mean states which have opposite logic levels. For example, in the case where the third state means a logic 'high' level, the fourth state may mean a logic 'low' level. Conversely, in the case where the third state means a logic 'low' level, the fourth state may mean logic 'high' level. The first and second states and the third and fourth states may not be related to each other.

Figure 6:
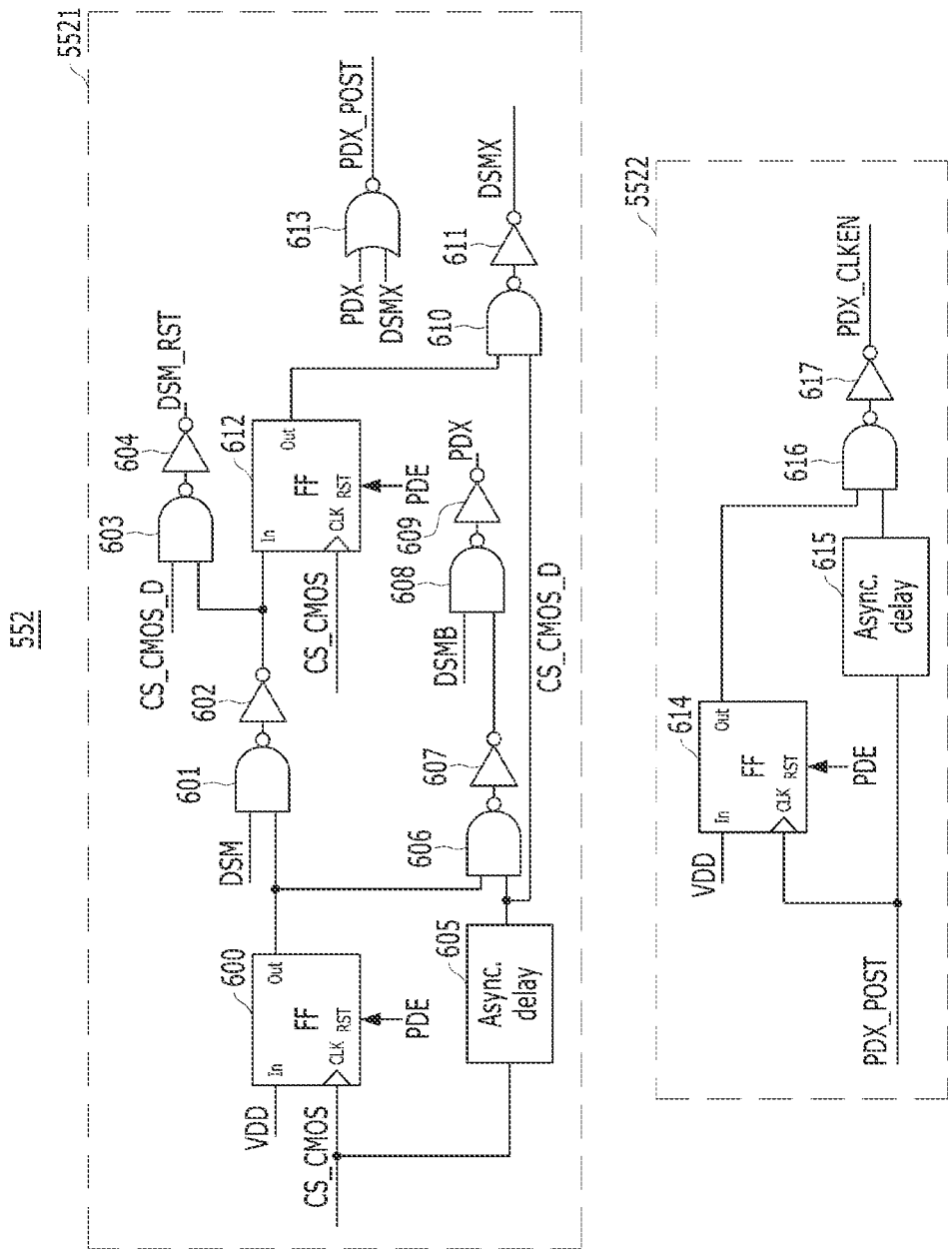
FIG. 6 is a detailed circuit diagram of a detection circuit among components of a power gating system, such as that illustrated in FIG. 5.

FIG. 6 is a detailed circuit diagram of the detection circuit among components of the power gating system illustrated in FIG. 5.

Referring to FIG. 6, a detailed circuit configuration of the detection circuit 552 included in the select control circuit 550 of the power gating system 100 is illustrated.

The first edge detection circuit 5521 included in the detection circuit 552 may include a first flip-flop 600, a first NAND gate 601, a first inverter 602, a second NAND gate 603, a second inverter 604, a first delay circuit 605, a third NAND gate 606, a third inverter 607, a fourth NAND gate 608, a fourth inverter 609, a fifth NAND gate 610, a fifth inverter 611, a second flip-flop 612, and a first NOR gate 613.

The second edge detection circuit 5522 included in the detection circuit 552 may include a third flip-flop 614, a second delay circuit 615, a sixth NAND gate 616, and a sixth inverter 617.

In detail, the first flip-flop 600 included in the first edge detection circuit 5521 may receive the power voltage VDD through a signal input terminal IN, may receive the chip select signal CS_CMOS, outputted from the first buffer circuit 510, through a clock input terminal CLK, and may receive the positive first select signal PDE or PDEB through a reset input terminal RST. For reference, the reason why the output signal of the first buffer circuit 510 is illustrated as the first chip select signal CS_CMOS1 or the third chip select signal CS_CMOS3 in FIG. 5 but is illustrated as the chip select signal CS_CMOS in FIG. 6 is because, as described above with reference to FIG. 5, the operation of the select control circuit 550 in which the first edge detection circuit 5521 is included includes the operation of checking a number of times the output signal of the first buffer circuit 510 is inputted and receiving the output signal of the first buffer circuit 510 as the first chip select signal CS_CMOS1 or the third chip select signal CS_CMOS3 depending on a checking result, Therefore, the output signal of the first buffer circuit 510 illustrated as the chip select signal CS_CMOS in FIG. 6 may be detected as the first chip select signal CS_CMOS1 or the third chip select signal CS_CMOS3 depending on the operation of the first edge detection circuit 5521.

The first delay circuit 605 included in the first edge detection circuit 5521 may output a delayed chip select signal CS_CMOS_D by delaying the chip select signal CS_CMOS, outputted from the first buffer circuit 510, by a first delay amount.

The first NAND gate 601 included in the first edge detection circuit 5521 may perform a NAND operation by receiving a signal applied from an output terminal OUT of the first flip-flop 600 and the detection select signal DSM.

The first inverter 602 included in the first edge detection circuit 5521 may receive and invert an output signal of the first NAND gate 601 and may output an output signal.

The second NAND gate 603 included in the first edge detection circuit 5521 may perform a NAND operation by receiving the output signal of the first inverter 602 and the delayed chip select signal CS_CMOS_D outputted from the first delay circuit 605.

The second inverter 604 included in the first edge detection circuit 5521 may receive and invert an output signal of the second NAND gate 603 and may output the third edge detection signal DSM_RST.

The second flip-flop 612 included in the first edge detection circuit 5521 may receive the output signal of the first inverter 602 through a signal input terminal IN, may receive the chip select signal CS_CMOS, outputted from the first buffer circuit 510, through a clock input terminal CLK, and may receive the positive first select signal PDE or PDEB through a reset input terminal RST.

The third NAND gate 606 included in the first edge detection circuit 5521 may perform a NAND operation by receiving the output signal of the first flip-flop 600 and the delayed chip select signal CS_CMOS_D outputted from the first delay circuit 605.

The third inverter 607 included in the first edge detection circuit 5521 may receive and invert an output signal of the third NAND gate 606 and may output an output signal.

The fourth NAND gate 608 included in the first edge detection circuit 5521 may perform a NAND operation by receiving an inverted signal DSMB of the detection select signal DSM and the signal outputted from the third inverter 607.

The fourth inverter 609 included in the first edge detection circuit 5521 may receive and invert an output signal of the fourth NAND gate 608 and may output a signal PDX.

The fifth NAND gate 610 included in the first edge detection circuit 5521 may perform a NAND operation by receiving an output signal of the second flip-flop 612 and the delayed chip select signal CS_CMOS_D outputted from the first delay circuit 605.

The fifth inverter 611 included in the first edge detection circuit 5521 may receive and invert an output signal of the fifth NAND gate 610 and may output a signal DSMX.

The first NOR gate 613 included in the first edge detection circuit 5521 may output the first edge detection signal PDX_POST by performing a NOR operation by receiving the signal PDX outputted from the fourth inverter 609 and the signal DSMX outputted from the fifth inverter 611.

The third flip-flop 614 included in the second edge detection circuit 5522 may receive the power voltage VDD through a signal input terminal IN, may receive the first edge detection signal PDX_POST through a clock input terminal CLK, and may receive the positive first select signal PDE or PDEB through a reset input terminal RST.

The second delay circuit 615 included in the second edge detection circuit 5522 may output a delayed signal by delaying the first edge detection signal PDX_POST by a second delay amount.

The sixth NAND gate 616 included in the second edge detection circuit 5522 may perform a NAND operation by receiving an output signal of the third flip-flop 614 and the output signal of the second delay circuit 615.

The sixth inverter 617 included in the second edge detection circuit 5522 may receive and invert an output signal of the sixth NAND gate 616 and may output the second edge detection signal PDX_CLKEN.

Figure 7:
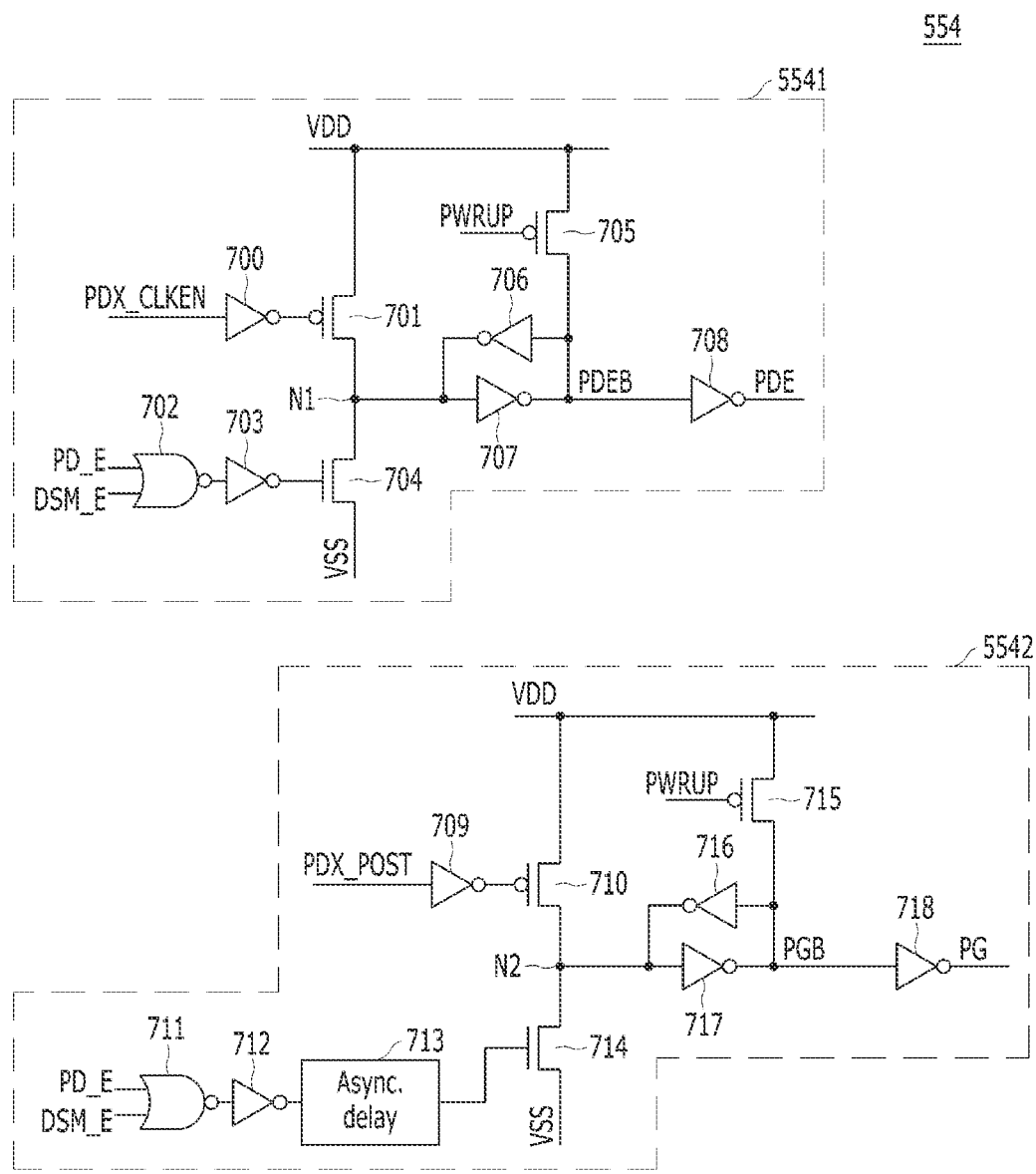
FIG. 7 is a detailed circuit diagram of a select signal generation circuit among components of a power gating system, such as that illustrated in FIG. 5.

FIG. 7 is a detailed circuit diagram of the select signal generation circuit among the components of the power gating system illustrated in FIG. 5.

Referring to FIG. 7, a detailed circuit configuration of the select signal generation circuit 554 included in the select control circuit 550 of the power gating system 100 is illustrated.

The first select signal generation circuit 5541 included in the select signal generation circuit 554 may include a first inverter 700, a first PMOS transistor 701, a first NOR gate 702, a second inverter 703, a first NMOS transistor 704, a second PMOS transistor 705, a third inverter 706, a fourth inverter 707, and a fifth inverter 708.

The second select signal generation circuit 5542 included in the select signal generation circuit 554 may include a sixth inverter 709, a third PMOS transistor 710, a second NOR gate 711, a seventh inverter 712, a delay circuit 713, a second NMOS transistor 714, a fourth PMOS transistor 715, an eighth inverter 716, a ninth inverter 717, and a tenth Inverter 718.

In detail, the first inverter 700 included in the first select signal generation circuit 5541 may receive and invert the second edge detection signal PDX_CLKEN and may output an output signal.

The first PMOS transistor 701 included in the first select signal generation circuit 5541 may have a gate to which the output signal of the first inverter 700 is inputted, a drain to which a terminal of the power voltage VDD is coupled, and a source to which a first intermediate node N1 is coupled.

The first NOR gate 702 included in the first select signal generation circuit 5541 may perform a NOR operation by receiving the signal PD_E which is generated as the first power-down command PD_CMD is synchronized with the first internal clock ISCLK, and the signal DSM_E which is generated as the second power-down command DSM_CMD is synchronized with the first internal clock ISCLK.

The second inverter 703 included in the first select signal generation circuit 5541 may receive and invert an output signal of the first NOR gate 702 and may output an output signal.

The first NMOS transistor 704 included in the first select signal generation circuit 5541 may have a gate to which the output signal of the second inverter 703 is inputted, a drain to which the ground voltage VSS is coupled, and a source which is coupled to the first intermediate node N1.

The second PMOS transistor 705 included in the first select signal generation circuit 5541 may have a gate to which a power-up signal PWRUP is inputted, a drain to which the power voltage VDD is coupled, and a source to which a terminal of the negative first select signal PDE or PDEB is coupled.

The third inverter 706 included in the first select signal generation circuit 5541 may receive and invert a signal which is loaded on the terminal of the negative first select signal PDE or PDEB, and may output an output signal to the first intermediate node N1.

The fourth inverter 707 included in the first select signal generation circuit 5541 may receive and invert a signal which is loaded on the first intermediate node N1, and may output the negative first select signal PDE or PDEB.

The fifth inverter 708 included in the first select signal generation circuit 5541 may receive and invert the negative first select signal PDE or PDEB, and may output the positive signal PDE.

The sixth inverter 709 included in the second select signal generation circuit 5542 may receive and invert the first edge detection signal PDX_POST and may output an output signal.

The third PMOS transistor 710 included in the second select signal generation circuit 5542 may have a gate to which the output signal of the sixth inverter 709 is inputted, a drain to which a terminal of the power voltage VDD is coupled, and a source which is coupled to a second intermediate node N2.

The second NOR gate 711 included in the second select signal generation circuit 5542 may perform a NOR operation by receiving the signal PDE which is generated as the first power-down command PD_CMD is synchronized with the first internal clock ISCLK, and the signal DSM_E which is generated as the second power-down command DSM_CMD is synchronized with the first internal clock ISCLK.

The seventh inverter 712 included in the second select signal generation circuit 5542 may receive and invert an output signal of the second NOR gate 711 and may output an output signal.

The delay circuit 713 included in the second select signal generation circuit 5542 may output an output signal by receiving and delaying by a set delay amount the output signal of the seventh inverter 712.

The second NMOS transistor 714 included in the second select signal generation circuit 5542 may have a gate to which the output signal of the delay circuit 713 is inputted, a drain to which the ground voltage VSS is coupled, and a source which is coupled to the second intermediate node N2.

The fourth PMOS transistor 715 included in the second select signal generation circuit 5542 may have a gate to which the power-up signal PWRUP is inputted, a drain to which the power voltage VDD is coupled, and a source to which a terminal of the negative second select signal PG or PGB is coupled.

The eighth inverter 716 included in the second select signal generation circuit 5542 may receive and invert a signal which is loaded on the terminal of the negative second select signal PG or PGB, and may output an output signal to the second intermediate node N2.

The ninth inverter 717 included in the second select signal generation circuit 5542 may receive and invert a signal which is loaded on the second intermediate node N2, and may output the negative second select signal PG or PGE.

The tenth inverter 718 included in the second select signal generation circuit 5542 may receive and invert the negative second select signal PG or PGB, and may output the positive signal PG.

For reference, the power-up signal PWRUP may be activated when a level of the power voltage VDD is stabilized after the supply of power to the semiconductor device 20 illustrated in FIG. 2 is started. For example, the power-up signal PWRUP may be activated to a logic 'low' when the level of the power voltage VDD rises above a set level.

Figure 8:
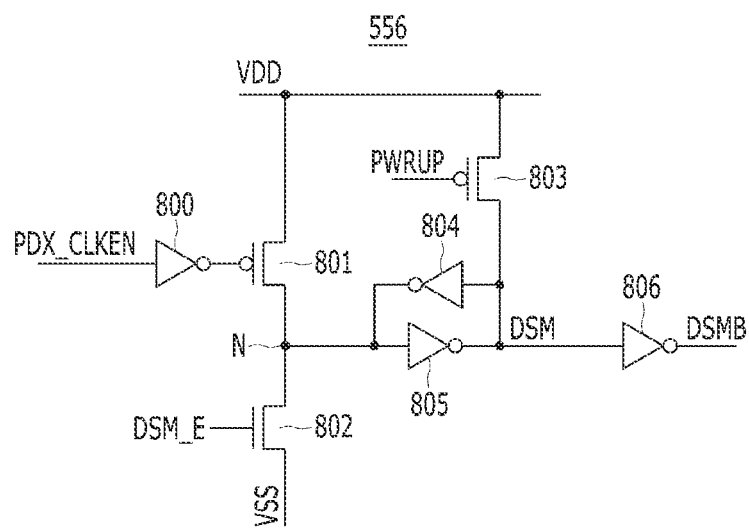
FIG. 8 is a detailed circuit diagram of a detecting operation select circuit among components of a power gating system, such as that illustrated in FIG. 5.

FIG. 8 is a detailed circuit diagram of the detecting operation select circuit among the components of the power gating system illustrated in FIG. 5.

Referring to FIG. 8, a detailed circuit configuration of the detecting operation select circuit 556 included in the select control circuit 550 of the power gating system 100 is illustrated in FIG. 5.

The detecting operation select circuit 556 may include a first inverter 800, a first PMOS transistor 801, a first NMOS transistor 802, a second PMOS transistor 803, a second inverter 804, a third inverter 805, and a fourth inverter 806.

In detail, the first inverter 800 included in the detecting operation select circuit 556 may receive and invert the second edge detection signal PDX_CLKEN and may output an output signal.

The first PMOS transistor 701 included in the detecting operation select circuit 556 may have a gate to which the output signal of the first inverter 800 is inputted, a drain to which a terminal of the power voltage VDD is coupled, and a source which is coupled to an intermediate node N.

The first NMOS transistor 802 included in the detecting operation select circuit 556 may have a gate to which the signal DSM_E generated as the second power-down command DSM_CMD is synchronized with the first internal clock ISCLK is inputted, a drain to which the ground voltage VSS is coupled, and a source which is coupled to the intermediate node N.

The second PMOS transistor 803 included in the detecting operation select circuit 556 may have a gate to which the power-up signal PWRUP is inputted, a drain to which the power voltage VDD is coupled, and a source to which a terminal of the detection select signal DSM is coupled.

The second inverter 804 included in the detecting operation select circuit 556 may receive and invert a signal which is loaded on the terminal of the detection select signal DSM, and may output an output signal to the intermediate node N.

The third inverter 805 included in the detecting operation select circuit 556 may receive and invert a signal which is loaded on the intermediate node N and may output the detection select signal DSM.

The fourth inverter 806 included in the detecting operation select circuit 556 may receive and invert the detection select signal DSM and may output the inverted signal DSMB of the detection select signal DSM.

Figure 9:
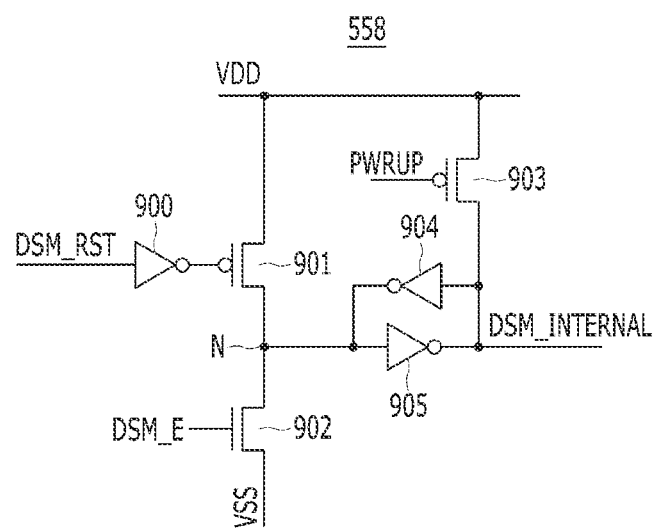
FIG. 9 is a detailed circuit diagram of an internal operation select circuit among components of a power gating system, such as that illustrated in FIG. 5.

FIG. 9 is a detailed circuit diagram of the internal operation select circuit among the components of the power gating system illustrated in FIG. 5.

Referring to FIG. 9, a detailed circuit configuration of the internal operation select circuit 558 included in the select control circuit 550 of the power gating system 100 is illustrated.

The internal operation select circuit 558 may include a first inverter 900, a first PMOS transistor 901, a first NMOS transistor 902, a second PMOS transistor 903, a second inverter 904, and a third inverter 905.

In detail, the first inverter 900 included in the internal operation select circuit 558 may receive and invert the third edge detection signal DSM_RST and may output an output signal.

The first PMOS transistor 901 included in the internal operation select circuit 558 may have a gate to which the output signal of the first inverter 900 is inputted, a drain to which a terminal of the power voltage VDD is coupled, and a source which is coupled to an intermediate node N.

The first NMOS transistor 902 included in the internal operation select circuit 558 may have a gate to which the signal DSM_E generated as the second power-down command DSM_CMD is synchronized with the first internal clock ISCLK is inputted, a drain to which the ground voltage VSS is coupled, and a source which is coupled to the intermediate node N.

The second PMOS transistor 903 included in the internal operation select circuit 558 may have a gate to which the power-up signal PWRUP is inputted, a drain to which the power voltage VDD is coupled, and a source to which a terminal of the internal select signal DSM_INTERNAL is coupled.

The second inverter 904 included in the internal operation select circuit 558 may receive and invert a signal which is loaded on the terminal of the internal select signal DSM_INTERNAL, and may output an output signal to the intermediate node N.

The third inverter 905 included in the internal operation select circuit 558 may receive and invert a signal which is loaded on the intermediate node N and may output the internal select signal DSM_INTERNAL.

Figure 10:
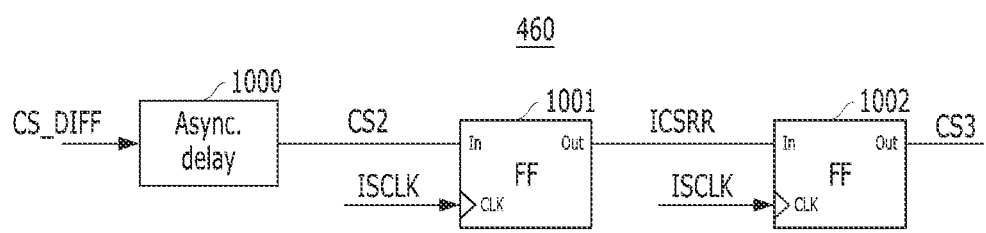
FIG. 10 is a detailed circuit diagram of a clock enable control circuit among components of a power gating system, such as that illustrated in FIG. 5.
Figure 10:
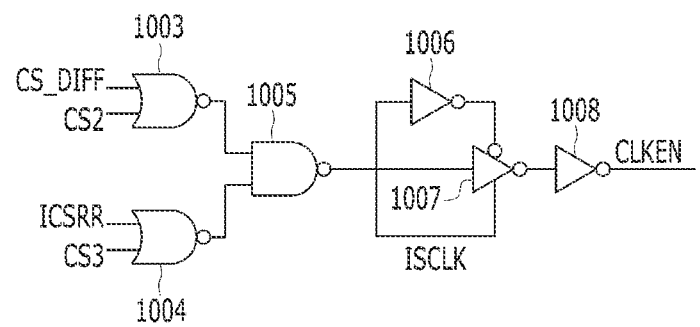

FIG. 10 is a detailed circuit diagram of the clock enable control circuit among the components of the power gating system illustrated in FIG. 5.

Referring to FIG. 10, a detailed circuit configuration of the clock enable control circuit 460 of the power gating system 100 is illustrated.

The clock enable control circuit 460 may include a delay circuit 1000, a first flip-flop 1001, a second flip-flop 1002, a first NOR gate 1003, a second NOR gate 1004, a first AND gate 1005, a first inverter 1006, a second inverter 1007, and a third inverter 1008.

In detail, the delay circuit 1000 included in the clock enable control circuit 460 may output a signal CS2 by delaying the second chip select signal CS_DIFF, received through the second buffer circuit 420, by a set delay amount.

The first flip-flop 1001 included in the clock enable control circuit 460 may receive the signal CS2, outputted from the delay circuit 1000, through a signal input terminal IN, may receive the first internal clock ISCLK through a clock input terminal CLK, and may output the command select code signal ICSRR through an output terminal OUT.

The second flip-flop 1002 included in the clock enable control circuit 460 may receive the command select code signal ICSRR, outputted from the first flip-flop 1001, through a signal input terminal IN, may receive the first internal clock ISCLK through a clock input terminal CLK, and may output a signal CS3 through an output terminal OUT.

The first NOR gate 1003 included in the clock enable control circuit 460 may perform a NOR operation by receiving the second chip select signal CS_DIFF received through the second buffer circuit 420 and the signal CS2 outputted from the delay circuit 1000.

The second NOR gate 1004 included in the clock enable control circuit 460 may perform a NOR operation by receiving the command select code signal ICSRR outputted from the first flip-flop 1001 and the signal CS3 outputted from the second flip-flop 1002.

The first AND gate 1005 included in the clock enable control circuit 460 may perform an AND operation by receiving an output signal of the first NOR gate 1003 and an output signal of the second NOR gate 1004.

The first inverter 1006 included in the clock enable control circuit 460 may receive and invert the first internal clock ISCLK and may output an output signal.

The second inverter 1007 included in the clock enable control circuit 460 may invert an output signal of the first AND gate 1005 in response to the first internal clock ISCLK inputted to a positive input terminal and the output signal of the first inverter 1006 inputted to a negative input terminal, and may output an output signal.

The third inverter 1008 included in the clock enable control circuit 460 may receive and invert the output signal of the second inverter 1007 and may output the clock enable signal CLKEN.

Figure 11:
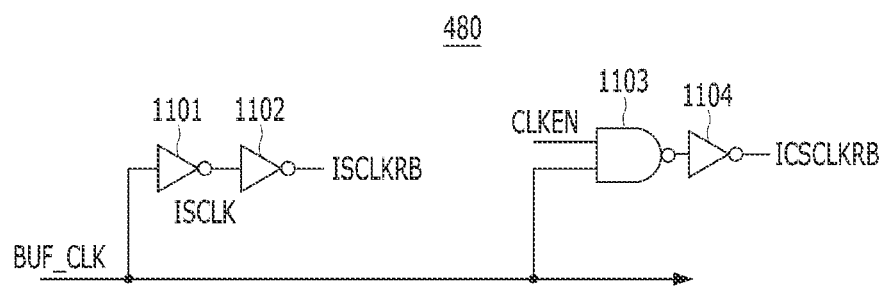
FIG. 11 is a detailed circuit diagram of a clock gating circuit among components of a power gating system, such as that illustrated in FIG. 5.

FIG. 11 is a detailed circuit diagram of the clock gating circuit among the components of the power gating system illustrated in FIG. 5.

Referring to FIG. 11, a detailed circuit configuration of the clock gating circuit 480 of the power gating system 100 is illustrated.

The clock gating circuit 480 may include a first inverter 1101, a second inverter 1102, a first NAND gate 1103, and a third inverter 1104.

In detail, the first inverter 1101 included in the clock gating circuit 480 may receive and invert the clock BUF_CLK received through the clock buffer circuit 440 and may output the first internal clock ISCLK.

The second inverter 1102 included in the clock gating circuit 480 may receive and invert the first internal clock ISCLK outputted from the first inverter 1101 and may output an inverted first internal clock ISCLKRB.

The first NAND gate 1103 included in the clock gating circuit 480 may perform a NAND operation by receiving the clock enable signal CLKEN outputted from the clock enable control circuit 460 and the clock BUF_CLK received through the clock buffer circuit 440.

The third inverter 1104 included in the clock gating circuit 480 may receive and invert an output signal of the first NAND gate 1103 and may output the second internal clock ICSCLKRB.

Figure 12:
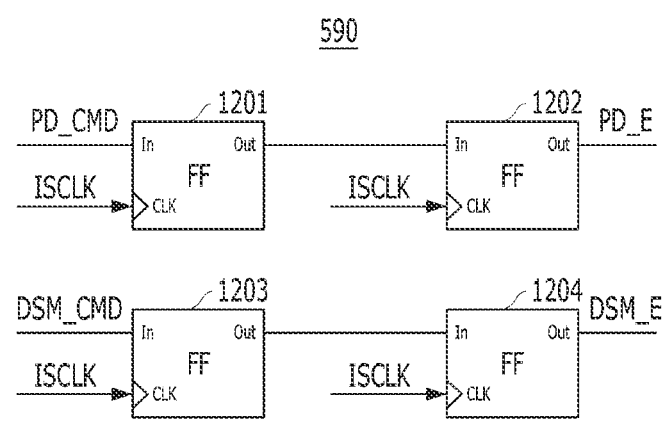
FIG. 12 is a detailed circuit diagram of a command transfer circuit among components of a power gating system, such as that illustrated in FIG. 5.

FIG. 12 is a detailed circuit diagram of the command transfer circuit among the components of the power gating system illustrated in FIG. 5.

Referring to FIG. 12, a detailed circuit configuration of the command transfer circuit 590 of the power gating system 100 is illustrated.

The command transfer circuit 590 may include a first flip-flop 1201, a second flip-flop 1202, a third flip-flop 1203, and a fourth flip-flop 1204.

In detail, the first flip-flop 1201 included in the command transfer circuit 590 may have a signal input terminal IN to which the first power-down command PD_CMD is inputted, and a clock input terminal CLK to which the first internal clock ISCLK is inputted.

The second flip-flop 1202 included in the command transfer circuit 590 may have a signal input terminal IN to which a signal applied from an output terminal OUT of the first flip-flop 1201 is inputted, a clock input terminal CLK to which the first internal clock ISCLK is inputted, and an output terminal OUT which outputs the signal PD_E.

The third flip-flop 1203 included in the command transfer circuit 590 may have a signal input terminal IN to which the second power-down command DSM_CMD is inputted, and a clock input terminal CLK to which the first internal clock ISCLK is inputted.

The fourth flip-flop 1204 included in the command transfer circuit 590 may have a signal input terminal IN to which a signal applied from an output terminal OUT of the third flip-flop 1203 is inputted, a clock input terminal CLK to which the first internal clock ISCLK is inputted, and an output terminal OUT which outputs the signal DSM_E.

FIG. 13 is a timing diagram to assist in the explanation of the operation of the power gating system illustrated in FIG. 5.

Referring to FIG. 13, the detailed operation timing of the power gating control circuit 101 is illustrated.

The external clock CLK may continuously toggle in the active mode and the power-down mode.

Further, the first internal clock ISCLK may continuously toggle in the active mode and the power-down mode.

In the active mode, the chip select signal CS, which is inputted in synchronization with an edge of the external clock CLK, may be received as the second chip select signal CS_DIFF through the second buffer circuit 420 (1).

In response to that the second chip select signal CS_DIFF is received in this way, the clock enable signal CLKEN may be activated (2).

Also, in response to that the second chip select signal CS_DIFF is received, the signal CS2 may be activated (3). In addition, in response to that the signal CS2 is activated, the command select code signal ICSRR may be activated (4).

Moreover, in response to that the command select code signal ICSRR is activated, the signal CS3 may be activated (5). At a time when the signal CS3 is deactivated, the clock enable signal CLKEN may be deactivated. The second internal clock ICSCLKRB toggles only during a period in which the clock enable signal CLKEN maintains an activated state.

The command/address signal BUF_CA<0:N> may be received through the third buffer circuit 530 during a period in which the clock enable signal CLKEN maintains an activated state. The command/address signal BUF_CA<0:N> received through the third buffer circuit 530 may be the second power-down command DSM_CMD. Therefore, the second power-down command DSM_GMD may be generated in response to the command/address signal BUF_CA<0:N> received through the third buffer circuit 530 (6). By synchronizing the second power-down command DSM_CMD, generated in this way, with the first internal clock ISCLK, the signal DSM_E may be generated (7).

In response to that the signal DSM_E is generated, the internal select signal DSM_INTERNAL may transition from the third state to the fourth state (8).

Also, in response to that the signal DSM_E is generated, the detection select signal DSM may transition from the first state to the second state (9).

By setting the first select signal PDE or PDEB to the second logic level in response to that the signal DSM_E is generated, the negative first select signal PDE or PDEB may be set to the first logic level (A). In response to that, in this way, the first select signal PDE or PDEB is set to the second logic level, entry to the second power-down mode may be made.

By setting the second select signal PG or PGB to the second logic level a set amount of time SD after the generation of the signal DSM_E, the negative second select signal PG or PGB may be set to the first logic level (B). In this way, by setting the second select signal PG or PGB to the second logic level a set amount of time SD after entry to the second power-down mode, the power supply circuit 1 and 2 included in the logic circuit region 102 may, in a stable state, not supply the external power VDD and VSS to the logic elements 3 and 4.

In the second power-down mode, a first chip select signal CS, that is, the third chip select signal CS_CMOS3, may be received through the first buffer circuit 510. In response to that the third chip select signal CS_CMOS3 is received in this way, the third edge detection signal DSM_RST may be generated (C).

In response to that the third edge detection signal DSM_RST is generated, the internal select signal DSM_INTERNAL may transition from the fourth state to the third state (D).

Further, in the second power-down mode, a second chip select signal CS, that is, the first chip select signal CS_CMOS1, may be received through the first buffer circuit 510. In response to that the first chip select signal CS_CMOS1 is received in this way, the first edge detection signal PDX_POST may be activated (E). The first edge detection signal PDX_POST may maintain an activated state during a period in which the first chip select signal CS_CMOS1 is received. In other words, the first edge detection signal PDX_POST may be activated at a time when reception of the first chip select signal CS_CMOS1 starts, that is, at a first edge of the first chip select signal CS_CMOS1, and may be deactivated at a time when reception of the first chip select signal CS_CMOS1 is completed, that is, at a second edge of the first chip select signal CS_CMOS1 (G).

By setting the second select signal PG or PGB to the first logic level at a time when the first edge detection signal PDX_POST is activated, that is, at the first edge of the first chip select signal CS_CMOS1, the negative second select signal PG or PGB may be set to the second logic level (F).

At a time when the first edge detection signal PDX_POST is deactivated, that is, at the second edge of the first chip select signal CS_CMOS1, the second edge detection signal PDX_CLKEN may be activated (H). Since the time when the first edge detection signal PDX_POST is deactivated is the time when reception of the first chip select signal CS_CMOS1 is completed, that is, the second edge of the first chip select signal CS_CMOS1, the second edge detection signal PDX_CLKEN is activated at the second edge of the first chip select signal CS_CMOS1.

By setting the first select signal PDE or PDEB to the first logic level at the time when the second edge detection signal PDX_CLKEN is activated, that is, at the second edge of the first chip select signal CS_CMOS1, the negative first select signal PDE or PDEB may be set to the second logic level (I).

In this way, after setting the second select signal PG or PGB to the first logic level at the first edge of the first chip select signal CS_CMOS1, the first select signal PDE or PDEB may be set to the first logic level at the second edge later than the first edge of the first chip select signal CS_CMOS1. Therefore, in response to that the second select signal PG or PGB is set to the first logic level, the first select signal PDE or PDEB may be set to the first logic level before exit from the second power-down mode (or entry to the active mode). In this way, by setting the first select signal PDE or PDEB to the first logic level before exit from the second power-down mode (or entry to the active mode), the power supply circuit 1 and 2 included in the logic circuit region 102 may, in a stable state, supply the external power VDD and VSS to the logic elements 3 and 4.

In response to that the second edge detection signal PDX_CLKEN is activated, the detection select signal DSM may transition from the first state to the second state (J).

Although various embodiments have been illustrated and described, it will be apparent to those skilled in the art that various changes and modifications may be made without departing from the spirit and scope of the invention as defined in the following claims.

For instance, positions and kinds of the logic gates and transistors described above may be different according to the polarities of the signals inputted thereto.

What is claimed is:

1. A semiconductor device comprising:
a first buffer circuit configured to receive a chip select signal in a power-down mode in response to a first select signal;
a second buffer circuit configured to receive the chip select signal in an active mode in response to the first select signal;
a power supply circuit configured to supply external power to a plurality of logic elements in the active mode in response to a second select signal, and not supply the external power to the plurality of logic elements in the power-down mode in response to the second select signal; and
a select control circuit configured to transition a logic level of the second select signal at a first edge of a first chip select signal received through the first buffer circuit in the power-down mode, and then transition a logic level of the first select signal at a following second edge of the first chip select signal to exit from the power-down mode and enter the active mode.

2. The semiconductor device of claim 1, wherein the select control circuit comprises:
a detection circuit configured to detect the first and second edges of the first chip select signal in the power-down mode; and
a select signal generation circuit configured to generate the first select signal and the second select signal in response to an output signal of the detection circuit and a power-down command corresponding to the power-down mode.

3. The semiconductor device of claim 2, wherein the detection circuit comprises:
a first edge detection circuit configured to generate a first edge detection signal by detecting the first edge of the first chip select signal in the power-down mode; and
a second edge detection circuit configured to generate a second edge detection signal by detecting the second edge of the first chip select signal in response to the first edge detection signal in the power-down mode.

4. The semiconductor device of claim 3, wherein the select signal generation circuit comprises:
a first select signal generation circuit configured to set the first select signal to a first logic level in response to the second edge detection signal; and
a second select signal generation circuit configured to set the second select signal to a first logic level in response to the first edge detection signal.

5. The semiconductor device of claim 4, wherein the select control circuit enters, in response to the power-down command, the power-down mode from the active mode by transitioning the logic level of the first select signal and then by transitioning the logic level of the second select signal a set amount of time after transitioning the logic level of the first select signal.

6. The semiconductor device of claim 5, wherein
the first select signal generation circuit sets the first select signal to a second logic level in response to the power-down command, and
the second select signal generation circuit sets, in response to the power-down command, the second select signal to a second logic level the set amount of time after the first select signal is set to the second logic level.

7. The semiconductor device of claim 6, wherein
the first buffer circuit outputs the first chip select signal by buffering the chip select signal received from an outside during a period in which the first select signal is set to a second logic level, and is disabled during a period in which the first select signal is set to the first logic level, and
the second buffer circuit outputs a second chip select signal by buffering the chip select signal received from an outside during the period in which the first select signal is set to the first logic level, and is disabled during the period in which the first select signal is set to the second logic level.

8. The semiconductor device of claim 7, wherein the power supply circuit supplies external power to the plurality of logic elements by allowing coupling of an external power line and a virtual power line during the period in which the second select signal is set to the first logic level, and blocks the external power from being supplied to the plurality of logic elements by cutting off coupling of the external power line and the virtual power line during the period in which the second select signal is set to the second logic level.

9. A semiconductor device comprising:
a first buffer circuit configured to receive a chip select signal in a first power-down mode or a second power-down mode in response to a first select signal;
a second buffer circuit configured to receive the chip select signal in an active mode in response to the first select signal;
a power supply circuit configured to supply external power to a plurality of logic elements in the active mode in response to a second select signal, and not supply the external power to the plurality of logic elements in the first power-down mode or the second power-down mode in response to the second select signal; and
a select control circuit configured to transition a logic level of the second select signal at a first edge of a first chip select signal received through the first buffer circuit in the first or second power-down mode, and then transition a logic level of the first select signal at a following second edge of the first chip select signal to exit from the power-down mode and enter the active mode,
wherein, in the first power-down mode, the select control circuit receives the chip select signal, first received through the first buffer circuit as the first chip select signal, and
wherein, in the second power-down mode, the select control circuit receives the chip select signal, first received through the first buffer circuit, as a third chip select signal, and receives the chip select signal, second received through the first buffer circuit in the second power-down mode, as the first chip select signal.

10. The semiconductor device of claim 9, wherein the select control circuit comprises:
a detection circuit configured to detect the first and second edges of the first chip select signal in the first power-down mode, and detect an edge of the third chip select signal and the first and second edges of the first chip select signal in the second power-down mode; and
a select signal generation circuit configured to generate the first select signal and the second select signal in response to an output signal of the detection circuit, a first power-down command corresponding to the first power-down mode and a second power-down command corresponding to the second power-down mode.

11. The semiconductor device of claim 10, wherein the detection circuit comprises:

a first edge detection circuit configured to generate a first edge detection signal by detecting the first edge of the first chip select signal in the first or second power-down mode, and generate a third edge detection signal by detecting a first edge of the third chip select signal in the second power-down mode; and a second edge detection circuit configured to generate a second edge detection signal by detecting the second edge of the first chip select signal in response to the first edge detection signal in the first or second power-down mode.

12. The semiconductor device of claim 11, wherein the select signal generation circuit comprises:

a first select signal generation circuit configured to set the first select signal to a first logic level in response to the second edge detection signal; and a second select signal generation circuit configured to set the second select signal to a first logic level in response to the first edge detection signal.

13. The semiconductor device of claim 12, wherein the select control circuit enters, in response to the first power-down command or the second power-down command, the first power-down mode or the second power-down mode from the active mode by transitioning the logic level of the first select signal and then by transitioning the logic level of the second select signal a set amount of time after transitioning the logic level of the first select signal.

14. The semiconductor device of claim 13, wherein the first select signal generation circuit sets the first select signal to a second logic level in response to the first power-down command or the second power-down command, and the second select signal generation circuit sets, in response to the first power-down command or the second power-down command, the second select signal to a second logic level a set amount of time after the first select signal is set to a second logic level.

15. The semiconductor device of claim 14, wherein the first buffer circuit outputs the third chip select signal or the first chip select signal by buffering the chip select signal received from an outside during a period in which the first select signal is set to a second logic level, and is disabled during a period in which the first select signal is set to the first logic level, and the second buffer circuit outputs a second chip select signal by buffering the chip select signal received from an outside during the period in which the first select signal is set to the first logic level, and is disabled during the period in which the first select signal is set to the second logic level.

16. The semiconductor device of claim 15, wherein the power supply circuit supplies external power to the plurality of logic elements by allowing coupling of an external power line and a virtual power line during the period in which the second select signal is set to the first logic level, and blocks the external power from being supplied to the plurality of logic elements by cutting off coupling of the external power line and the virtual power line during the period in which the second select signal is set to the second logic level.

17. The semiconductor device of claim 12, wherein the select control circuit further comprises: a detecting operation select circuit configured to generate a detection select signal which is initialized to a first state, and, after transitioning the detection select signal to a second state in response to the second power-down command, transition the detection select signal to the first state in response to the second edge detection signal.

18. The semiconductor device of claim 17, wherein the detection circuit performs an operation in response to the detection select signal of the first state in the first power-down mode, and wherein the detection circuit performs an operation in response to the detection select signal of the second state in the second power-down mode.

19. The semiconductor device of claim 18, further comprising an internal circuit, and wherein the select control circuit further comprises: an internal operation select circuit configured to generate an internal select signal which is initialized to a third state, and, after transitioning the internal select signal to a fourth state in response to the second power-down command, transition the internal select signal to the third state in response to the third edge detection signal, wherein the internal circuit configured to be enabled in response to the internal select signal of the third state and be disabled in response to the internal select signal of the fourth state.

20. A semiconductor device comprising:

a power-gated circuitry configured to become activated and operative in response to a second select signal; and a power gating control circuit configured to control the activation of the power-gated circuitry, and including:

first circuitry configured to:

stay activated in an active mode and stay deactivated in a power-down mode, and exit the power-down mode and enter the active mode in response to a first select signal; and second circuitry configured to provide, in the power-down mode, the second select signal at a first edge of a control signal and the first select signal at a second edge, immediately following the first edge, of the control signal.

* * * * *